United States Patent
Lee et al.

(10) Patent No.: US 12,136,539 B1
(45) Date of Patent: Nov. 5, 2024

(54) SEMICONDUCTOR DEVICE FABRICATION APPARATUS

(71) Applicant: SK enpulse Co., Ltd., Gyeonggi-do (KR)

(72) Inventors: Jong Kyu Lee, Seoul (KR); Hyun Soo Lee, Seoul (KR); Il Gu Yong, Seoul (KR); Do Hyun Choi, Seoul (KR); Ho Geun Han, Seoul (KR)

(73) Assignee: SK Enpulse Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/647,944

(22) Filed: Apr. 26, 2024

(30) Foreign Application Priority Data

Apr. 26, 2023 (KR) .................. 10-2023-0054455
Apr. 26, 2023 (KR) .................. 10-2023-0054456
Apr. 26, 2023 (KR) .................. 10-2023-0054457

(51) Int. Cl.
*H01J 37/32* (2006.01)
*C23C 16/455* (2006.01)

(52) U.S. Cl.
CPC .. *H01J 37/32541* (2013.01); *C23C 16/45565* (2013.01)

(58) Field of Classification Search
None
See application file for complete search history.

(56) References Cited

U.S. PATENT DOCUMENTS

| | | | |
|---|---|---|---|
| 2003/0089314 A1* | 5/2003 | Matsuki | H01J 37/32009 118/715 |
| 2005/0022934 A1* | 2/2005 | Kwon | H01J 37/32082 156/345.47 |
| 2008/0276958 A1* | 11/2008 | Mehta | B08B 7/0035 134/1.2 |
| 2014/0299273 A1* | 10/2014 | Fischer | H01J 37/32541 315/111.21 |
| 2019/0244793 A1* | 8/2019 | Chen | H01J 37/3244 |
| 2020/0385862 A1 | 12/2020 | Srivastava et al. | |

(Continued)

FOREIGN PATENT DOCUMENTS

| | | |
|---|---|---|
| JP | 2005051198 A | 2/2005 |
| JP | 2013211574 A | 10/2013 |
| JP | 2022509636 A | 1/2022 |

(Continued)

*Primary Examiner* — Ram N Kackar
*Assistant Examiner* — Laureen Chan
(74) *Attorney, Agent, or Firm* — IP & T GROUP LLP

(57) ABSTRACT

An embodiment of the present disclosure provides an upper electrode including a flat upper surface; a lower surface facing the upper surface; and a thickness from the upper surface to the lower surface, wherein the lower surface includes a first profile corresponding to the central area of the lower surface and having a first thickness change rate of −0.1 to 0; a third profile surrounding the first profile and having a third thickness change rate of −0.115 to −0.122; and a fifth profile surrounding the third profile and having a fifth thickness change rate of −0.003 to 0.003, wherein the first thickness change rate, the third thickness change rate, and the fifth thickness change rate are values obtained by dividing a change in thickness by a change in radius along a horizontal direction parallel to the upper surface from a center of the lower surface.

20 Claims, 6 Drawing Sheets

(56) References Cited

U.S. PATENT DOCUMENTS

2022/0051877 A1* 2/2022 Kim .................. H01J 37/32642
2023/0011938 A1 1/2023 Pemmasani et al.

FOREIGN PATENT DOCUMENTS

| | | |
|---|---|---|
| JP | 2023088520 A | 6/2023 |
| KR | 102035960 B1 | 10/2019 |
| KR | 102236832 B1 | 4/2021 |
| KR | 102275987 B1 | 7/2021 |
| KR | 20210089121 A | 7/2021 |
| KR | 20220021514 A | 2/2022 |
| KR | 20220138849 A | 10/2022 |
| KR | 20230039182 A | 3/2023 |
| TW | 1811820 B | 8/2023 |

* cited by examiner

SEMICONDUCTOR DEVICE FABRICATION APPARATUS

CROSS-REFERENCE TO RELATED APPLICATION

This application claims priority under 35 U.S.C. § 119 to Korean Patent Application Nos. 10-2023-0054455, 10-2023-0054456 and 10-2023-0054457 filed on Apr. 26, 2023. The entire disclosure of each of the foregoing applications is incorporated herein by reference in its entirety.

BACKGROUND

Technical Field

Embodiments of the present disclosure relate to an upper electrode for a semiconductor device fabrication apparatus, the semiconductor device fabrication apparatus including the same, and a method of fabricating the semiconductor device.

Background Art

In general, a semiconductor etching showerhead is a device used to etch a silicon wafer by spraying gas in a plasma state onto the silicon wafer in a semiconductor fabrication chamber.

The showerhead has a plurality of gas injection holes, and gas in a plasma state passes through the gas injection holes.

To precisely etch the wafer, the showerhead holes must be precisely formed.

In the related art document 1 (Korean Patent No. 10-0299975) and the related art document 2 (Korean Patent No. 10-0935418), an abrasive and a silicon disk are placed against a drilling plate on which a plurality of tips protrudes. Then, while supplying the abrasive to the drilling plate and the disk, ultrasonic waves are applied to the drilling plate to drill the disk.

In the related art document 1 and the related art document 2, when processing a thick showerhead, the length of the pin inserted into the drilling plate increases. In this case, the pin vibrates when ultrasonic waves are generated, causing an issue in which the holes of the showerhead are not formed uniformly.

In particular, in the case of silicon carbide (Sic) containing silicon (Si) and carbon (C) in a ratio of 1:1, due to strong covalent bonds thereof, the silicon carbide (Sic) has high thermal conductivity compared to other ceramic materials and has excellent wear resistance, high-temperature strength, and chemical resistance. Accordingly, the silicon carbide (Sic) is widely applied to reinforce, supplement or replace components that are weak or essential in terms of mechanical properties. In particular, the silicon carbide has a Mohs hardness of 9.2, the second highest after diamond, and is widely used in the field of semiconductor components due to excellent durability thereof.

Therefore, embodiments of the present disclosure have been made in view of the above issues. It is an object of the present invention to provide an upper electrode capable of forming plasma uniformly, suppressing generation of residual by-products, and preventing occurrence of defects, a semiconductor device fabrication apparatus including the same, and a method of fabricating a semiconductor device.

SUMMARY

In accordance with embodiments of the present disclosure, provided is an upper electrode including a flat upper surface; a lower surface facing the upper surface; and a thickness from the upper surface to the lower surface, wherein the lower surface includes a first profile corresponding to a central area of the lower surface and having a first thickness change rate of −0.1 to 0; a second profile surrounding the first profile and having a second thickness change rate; a third profile surrounding the first profile and having a third thickness change rate of −0.115 to −0.122; a fourth profile surrounding the third profile and having a fourth thickness change rate; and a fifth profile surrounding the fourth profile and having a fifth thickness change rate of −0.003 to 0.003, wherein the first thickness change rate, the second thickness change rate, the third thickness change rate, the fourth thickness change rate, and the fifth thickness change rate are values obtained by dividing a change in thickness by a change in radius along a horizontal direction parallel to the upper surface from a center of the lower surface.

In the upper electrode according to one embodiment, the first profile may correspond to an area from a center of the upper surface to a first radius in the horizontal direction, the third profile may correspond to an area from a second radius, which is larger than the first radius, to a third radius in the horizontal direction, and the fifth profile may correspond to an area from a fourth radius, which is larger than the third radius, to a fifth radius.

In the upper electrode according to one embodiment, the first radius may be 7.5 mm to 9.5 mm, the second radius may be 11 mm to 14 mm, the third radius may be 48 mm to 54 mm, the fourth radius may be 88 mm to 92 mm, and the fifth radius may be 98 mm to 102 mm.

In the upper electrode according to one embodiment, in the third profile, a deviation of the third thickness change rate may be less than 0.005.

In the upper electrode according to one embodiment, in the fifth profile, a deviation of the fifth thickness change rate may be less than 0.005.

In the upper electrode according to one embodiment, the upper electrode may include single-crystal silicon and may have a thickness of 14 mm to 20 mm at a center of the lower surface and a thickness of 6 mm to 10 mm at the fifth profile.

In the upper electrode according to one embodiment, the lower surface may include a second profile located between the first profile and the third profile; and a fourth profile located between the third profile and the fifth profile.

In the upper electrode according to one embodiment, the second profile may have a second thickness change rate of −0.12 to −0.08, and the fourth profile may have a fourth thickness change rate of −0.12 to 0.003.

In the upper electrode according to one embodiment, the second thickness change rate may gradually decrease as a measurement point moves away from the center of the lower surface, and the fourth thickness change rate may gradually increase as a measurement point moves away from the center of the lower surface.

The upper electrode according to one embodiment may include single-crystal silicon, and the first profile, the second profile, the third profile, the fourth profile, and the fifth profile may be integrally connected.

In accordance with another embodiment of the present disclosure, provided is a semiconductor device fabrication apparatus including an upper electrode that faces a semiconductor substrate and sprays a process gas; a support portion that supports the semiconductor substrate and is disposed below the semiconductor substrate; and a focus ring that surrounds the semiconductor substrate and is mounted on the support portion, wherein the upper electrode includes a flat upper surface; a lower surface facing the upper surface; and a thickness from the upper surface to the lower surface, wherein the lower surface includes a first profile corresponding to a central area of the lower surface and having a first thickness change rate of −0.1 to 0; a third profile surrounding the first profile and having a third thickness change rate of −0.115 to −0.122; and a fifth profile surrounding the third profile and having a fifth thickness change rate of −0.003 to 0.003, wherein the first thickness change rate, the third thickness change rate, and the fifth thickness change rate are values obtained by dividing a change in thickness by a change in radius along a horizontal direction parallel to the upper surface from a center of the lower surface.

In accordance with still another embodiment of the present disclosure, provided is a method of fabricating a semiconductor device, the method including placing a semiconductor substrate on a semiconductor device fabrication apparatus; and treating the semiconductor substrate, wherein the semiconductor device fabrication apparatus includes an upper electrode that faces the semiconductor substrate and sprays a process gas; a support portion that supports the semiconductor substrate and is disposed below the semiconductor substrate; and a focus ring that surrounds the semiconductor substrate and is mounted on the support portion, wherein the upper electrode includes a flat upper surface; a lower surface facing the upper surface; and a thickness from the upper surface to the lower surface, wherein the lower surface includes a first profile corresponding to a central area of the lower surface and having a first thickness change rate of −0.1 to 0; a third profile surrounding the first profile and having a third thickness change rate of −0.115 to −0.122; and a fifth profile surrounding the third profile and having a fifth thickness change rate of −0.003 to 0.003, wherein the first thickness change rate, the third thickness change rate, and the fifth thickness change rate are values obtained by dividing a change in thickness by a change in radius along a horizontal direction parallel to the upper surface from a center of the lower surface.

In accordance with still another embodiment of the present disclosure, provided is an upper electrode including a flat upper surface; a lower surface facing the upper surface; and a thickness from the upper surface to the lower surface, wherein the lower surface includes a first profile corresponding to a central area of the lower surface and having a first thickness change rate that gradually decreases from a center of the lower surface to an edge thereof within a range of −0.385 to 0; a second profile surrounding the first profile and having a second thickness change rate of −0.37 to −0.39; a third profile surrounding the second profile and having a third thickness change rate that gradually increases from the center of the lower surface to the edge within a range of −0.385 to 0; a fourth profile surrounding the third profile and having a fourth thickness change rate that gradually increases from the center of the lower surface to the edge within a range of 0 to 0.105; a fifth profile surrounding the fourth profile and having a fifth thickness change rate of 0.1 to 0.11; and a seventh profile surrounding the fifth profile and having a seventh thickness change rate of −0.003 to 0.003, wherein the first thickness change rate, the second thickness change rate, the third thickness change rate, the fourth thickness change rate, the fifth thickness change rate, and the seventh thickness change rate are values obtained by dividing a change in thickness by a change in radius along a horizontal direction parallel to the upper surface from the center of the lower surface.

In the upper electrode according to one embodiment, the first profile may correspond to an area from a center of the upper surface to a first radius in the horizontal direction, the second profile may correspond to an area from the first radius to a second radius in the horizontal direction, the third profile may correspond to an area from the second radius to a third radius in the horizontal direction, the fourth profile may correspond to an area from the third radius to a fourth radius in the horizontal direction, and the fifth profile may correspond to an area from the fourth radius to a fifth radius.

In the upper electrode according to one embodiment, the first radius may be 3 mm to 5 mm, the second radius may be 8 mm to 10 mm, the third radius may be 75 mm to 85 mm, the fourth radius may be 108 mm to 114 mm, and the fifth radius may be 138 mm to 141 mm.

In the upper electrode according to one embodiment, at the second profile, a deviation of the second thickness change rate may be less than 0.03.

In the upper electrode according to one embodiment, at the fourth profile, a deviation of the fourth thickness change rate may be less than 0.03.

In the upper electrode according to one embodiment, at the seventh profile, a deviation of the seventh thickness change rate may be less than 0.003.

In the upper electrode according to one embodiment, the first thickness change rate at the center may be −0.003 to 0.003, and the first thickness change rate at the first radius may be −0.37 to −0.39.

In the upper electrode according to one embodiment, the third thickness change rate at the second radius may be −0.37 to −0.39, and the third thickness change rate at the third radius may be −0.003 to 0.003.

In the upper electrode according to one embodiment, the fourth thickness change rate at the third radius may be −0.003 to 0.003, and the fourth thickness change rate at the fourth radius may be 0.1 to 0.11.

The upper electrode according to one embodiment may include single-crystal silicon, a thickness at the center of the lower surface may be 22 mm to 25 mm, a thickness at an area where the third profile and the fourth profile meet may be 9 mm to 12 mm, and a thickness at the seventh profile may be 11 mm to 16 mm.

In the upper electrode according to one embodiment, the lower surface may include a sixth profile located between the fifth profile and the seventh profile.

In the upper electrode according to one embodiment, the sixth profile may have a sixth thickness change rate that gradually decreases from the center to the edge within a range of 0 to 0.11.

The upper electrode according to one embodiment may include single-crystal silicon, and the first profile, the second profile, the third profile, the fourth profile, the fifth profile, the sixth profile, and the seventh profile may be integrally connected.

In the upper electrode according to one embodiment, a ratio of a sum of a width of the first profile, a width of the second profile, and a width of the third profile to a sum of the width of the fourth profile, the width of the fifth profile, and the width of the sixth profile may be 51:49 to 59:41.

In accordance with still another embodiment of the present disclosure, provided is a semiconductor device fabrication apparatus including an upper electrode that is disposed on a semiconductor substrate and forms plasma; an electrostatic chuck configured to support the semiconductor substrate and disposed below the semiconductor substrate; and a focus ring that surrounds the semiconductor substrate and is mounted on the electrostatic chuck, wherein the upper electrode includes a flat upper surface; a lower surface facing the upper surface; and a thickness from the upper surface to the lower surface, wherein the lower surface includes a first profile corresponding to a central area of the lower surface and having a first thickness change rate that gradually decreases from a center of the lower surface to an edge thereof within a range of −0.385 to 0; a second profile surrounding the first profile and having a second thickness change rate of −0.37 to −0.39; a third profile surrounding the second profile and having a third thickness change rate that gradually increases from the center of the lower surface to the edge within a range of −0.385 to 0; a fourth profile surrounding the third profile and having a fourth thickness change rate that gradually increases from the center of the lower surface to the edge within a range of 0 to 0.105; a fifth profile surrounding the fourth profile and having a fifth thickness change rate of 0.1 to 0.11; and a seventh profile surrounding the fifth profile and having a seventh thickness change rate of −0.003 to 0.003, wherein the first thickness change rate, the second thickness change rate, the third thickness change rate, the fourth thickness change rate, the fifth thickness change rate, and the seventh thickness change rate are values obtained by dividing a change in thickness by a change in radius along a horizontal direction parallel to the upper surface from the center of the lower surface.

In accordance with still another embodiment of the present disclosure, provided is a method of fabricating a semiconductor device, the method including placing a semiconductor substrate on a semiconductor device fabrication apparatus; and treating the semiconductor substrate, wherein the semiconductor device fabrication apparatus includes an upper electrode that is disposed on the semiconductor substrate and forms plasma; an electrostatic chuck configured to support the semiconductor substrate and disposed below the semiconductor substrate; and a focus ring that surrounds the semiconductor substrate and is mounted on the electrostatic chuck, wherein the upper electrode includes a flat upper surface; a lower surface facing the upper surface; and a thickness from the upper surface to the lower surface, wherein the lower surface includes a first profile corresponding to a central area of the lower surface and having a first thickness change rate that gradually decreases from a center of the lower surface to an edge thereof within a range of −0.385 to 0; a second profile surrounding the first profile and having a second thickness change rate of −0.37 to −0.39; a third profile surrounding the second profile and having a third thickness change rate that gradually increases from the center of the lower surface to the edge within a range of −0.385 to 0; a fourth profile surrounding the third profile and having a fourth thickness change rate that gradually increases from the center of the lower surface to the edge within a range of 0 to 0.105; a fifth profile surrounding the fourth profile and having a fifth thickness change rate of 0.1 to 0.11; and a seventh profile surrounding the fifth profile and having a seventh thickness change rate of −0.003 to 0.003, wherein the first thickness change rate, the second thickness change rate, the third thickness change rate, the fourth thickness change rate, the fifth thickness change rate, and the seventh thickness change rate are values obtained by dividing a change in thickness by a change in radius along a horizontal direction parallel to the upper surface from the center of the lower surface.

In accordance with still another embodiment of the present disclosure, provided is an upper electrode including a flat upper surface; a lower surface facing the upper surface; and a thickness from the upper surface to the lower surface, wherein the lower surface includes a first profile corresponding to a central area of the lower surface and having a first thickness change rate of −0.25 to 0; a second profile surrounding the first profile and having a second thickness change rate of −0.25 to −0.24; a fourth profile surrounding the second profile and having a fourth thickness change rate of −0.003 to 0.003; a sixth profile surrounding the fourth profile and having a sixth thickness change rate of 0.13 to 0.14; and an eighth profile surrounding the sixth profile and having an eighth thickness change rate of −0.003 to 0.003, wherein the first thickness change rate, the second thickness change rate, the fourth thickness change rate, the sixth thickness change rate, and the eighth thickness change rate are values obtained by dividing a change in thickness by a change in radius along a horizontal direction parallel to the upper surface from the center of the lower surface.

In the upper electrode according to one embodiment, the first profile may correspond to an area from a center of the upper surface to a first radius in the horizontal direction, the second profile may correspond to an area from the first radius to a second radius in the horizontal direction, the fourth profile may correspond to an area from a third radius to a fourth radius in the horizontal direction, the sixth profile may correspond to an area from a fifth radius to a sixth radius in the horizontal direction, and the eighth profile may correspond to an area from a seventh radius to an eighth radius.

In the upper electrode according to one embodiment, the first radius may be 3 mm to 5 mm, the second radius may be 16 mm to 19 mm, the third radius may be 69 mm to 71 mm, the fourth radius may be 74 mm to 76 mm, the fifth radius may be 106 mm to 108 mm, the sixth radius may be 138 mm to 139.5 mm, the seventh radius may be 141 mm to 142 mm, and the eighth radius may be 144.5 mm to 150 mm.

In the upper electrode according to one embodiment, at the second profile, a deviation of the second thickness change rate may be less than 0.01.

In the upper electrode according to one embodiment, at the fourth profile, a deviation of the fourth thickness change rate may be less than 0.003.

In the upper electrode according to one embodiment, at the eighth profile, a deviation of the eighth thickness change rate may be less than 0.003.

The upper electrode according to one embodiment may include single-crystal silicon, a thickness at the center of the lower surface may be 15 mm to 25 mm, a thickness at the sixth profile may be 8 mm to 12 mm, and a thickness at the eighth profile may be 14 mm to 17 mm.

In the upper electrode according to one embodiment, the lower surface may include a third profile located between the second profile and the fourth profile; a fifth profile located between the fourth profile and the sixth profile; and a seventh profile located between the sixth profile and the eighth profile.

In the upper electrode according to one embodiment, the third profile may have a third thickness change rate of −0.24 to 0, the fifth profile may have a fifth thickness change rate of 0 to 0.12, and the seventh profile may have a seventh thickness change rate of 0 to 0.13.

In the upper electrode according to one embodiment, the third thickness change rate may gradually increase as a measurement point moves away from the center of the lower surface, the fifth thickness change rate may gradually increase as a measurement point moves away from the center of the lower surface, and the seventh thickness change rate may gradually decrease as a measurement point moves away from the center of the lower surface.

The upper electrode according to one embodiment may include single-crystal silicon, and the first profile, the second profile, the third profile, the fourth profile, the fifth profile, the sixth profile, the seventh profile, and the eighth profile may be integrally connected.

In accordance with still another embodiment of the present disclosure, provided is a semiconductor device fabrication apparatus including an upper electrode that is disposed on a semiconductor substrate and forms plasma; an electrostatic chuck configured to support the semiconductor substrate and disposed below the semiconductor substrate; and a focus ring that surrounds the semiconductor substrate and is mounted on the electrostatic chuck, wherein the upper electrode includes a flat upper surface; a lower surface facing the upper surface; and a thickness from the upper surface to the lower surface, wherein the lower surface includes a first profile corresponding to a central area of the lower surface and having a first thickness change rate of −0.25 to 0; a second profile surrounding the first profile and having a second thickness change rate of −0.25 to −0.24; a fourth profile surrounding the second profile and having a fourth thickness change rate of −0.003 to 0.003; a sixth profile surrounding the fourth profile and having a sixth thickness change rate of 0.13 to 0.14; and an eighth profile surrounding the sixth profile and having an eighth thickness change rate of −0.003 to 0.003, wherein the first thickness change rate, the second thickness change rate, the fourth thickness change rate, the sixth thickness change rate, and the eighth thickness change rate are values obtained by dividing a change in thickness by a change in radius along a horizontal direction parallel to the upper surface from the center of the lower surface.

In accordance with yet another embodiment of the present disclosure, provided is a method of fabricating a semiconductor device, the method including placing a semiconductor substrate on a semiconductor device fabrication apparatus; and treating the semiconductor substrate, wherein the semiconductor device fabrication apparatus includes an upper electrode that is disposed on the semiconductor substrate and forms plasma; an electrostatic chuck configured to support the semiconductor substrate and disposed below the semiconductor substrate; and a focus ring that surrounds the semiconductor substrate and is mounted on the electrostatic chuck, wherein the upper electrode includes a flat upper surface; a lower surface facing the upper surface; and a thickness from the upper surface to the lower surface, wherein the lower surface includes a first profile corresponding to a central area of the lower surface and having a first thickness change rate of −0.25 to 0; a second profile surrounding the first profile and having a second thickness change rate of −0.25 to −0.24; a fourth profile surrounding the second profile and having a fourth thickness change rate of −0.003 to 0.003; a sixth profile surrounding the fourth profile and having a sixth thickness change rate of 0.132 to 0.14; and an eighth profile surrounding the sixth profile and having an eighth thickness change rate of −0.003 to 0.003, wherein the first thickness change rate, the second thickness change rate, the fourth thickness change rate, the sixth thickness change rate, and the eighth thickness change rate are values obtained by dividing a change in thickness by a change in radius along a horizontal direction parallel to the upper surface from the center of the lower surface.

The upper electrode may be mounted on the semiconductor device fabrication apparatus according to one embodiment.

The thickness of an upper electrode according to an embodiment can vary depending on the radius thereof.

Accordingly, the lower surface of the upper electrode according to an embodiment includes a first profile having a first thickness change rate, a third profile having a third thickness change rate, and a fifth profile having a fifth thickness change rate.

In particular, the first thickness change rate can be approximately −0.1 to approximately 0, the third thickness change rate can be approximately −0.115 to approximately −0.122, and the fifth thickness change rate can be approximately −0.003 to approximately 0.003.

Accordingly, the thickness of the upper electrode according to an embodiment can gradually decrease from the center to the edge. That is, the lower surface of the upper electrode according to an embodiment can have a profile that is appropriately thin while having a convex shape at the center.

Accordingly, the upper electrode according to an embodiment can reinforce plasma in the central portion to improve the straightness of the plasma.

Accordingly, the upper electrode according to an embodiment can generate an overall uniform plasma.

In particular, as the diameter of the upper electrode increases, the plasma density of the upper electrode may decrease toward the central portion. At this time, since the upper electrode includes profiles having the thickness change rates described above, overall uniform plasma can be implemented.

In addition, the upper electrode according to an embodiment can suppress generation of residual process by-products. That is, the upper electrode according to an embodiment can prevent adsorption of residual process by-products.

Accordingly, in a process for fabricating a semiconductor device, the upper electrode according to an embodiment can prevent defects such as scratches and chatter marks.

In addition, the thickness of the upper electrode according to an embodiment can vary depending on the radius thereof. Accordingly, the lower surface of the upper electrode according to an embodiment includes a first profile having a first thickness change rate, a second profile having a second thickness change rate, a third profile having a third thickness change rate, a fourth profile having a fourth thickness change rate, a fifth profile having a fifth thickness change rate, and a seventh profile having a seventh thickness change rate.

When the first thickness change rate is within the range of −0.385 to 0, the thickness gradually decreases from the center of the lower surface to the edge, and the second thickness change rate is −0.37 to −0.39. When the third profile is within the range of −0.385 to 0, the thickness gradually increases from the center of the lower surface to the edge. When the fourth thickness change rate is within the range of 0 to 0.105, the thickness gradually increases from the center of the lower surface to the edge, the fifth thickness change rate is 0.1 to 0.11, and the seventh thickness change rate is −0.003 to 0.003.

Accordingly, from the center to the edge, the thickness of the upper electrode according to an embodiment can gradually decrease and then gradually increase again. That is, the lower surface of the upper electrode according to an embodiment can have a profile that gradually becomes thinner and then thicker again while having a convex shape. In addition, the upper electrode according to an embodiment can have the characteristic of rapidly changing thickness near the center.

Accordingly, the upper electrode according to an embodiment can reinforce plasma in the central portion and edge portion to improve the straightness of the plasma.

Accordingly, the upper electrode according to an embodiment can generate an overall uniform plasma.

In particular, as the diameter of the upper electrode increases, plasma density may be reduced in the central portion and the edge portion of the upper electrode. However, because the upper electrode includes profiles having the thickness change rates described above, an overall uniform plasma can be implemented.

In addition, since the upper electrode according to an embodiment implements overall uniform plasma, generation of residual process by-products can be suppressed. That is, the upper electrode according to an embodiment can prevent adsorption of residual process by-products.

Accordingly, in a process for fabricating a semiconductor device, the upper electrode according to an embodiment can prevent defects such as scratches and chatter marks.

In addition, in the process for fabricating a semiconductor device, since the upper electrode according to an embodiment prevents plasma from concentrating at a specific area, etching of the specific area can be prevented.

Accordingly, the upper electrode according to an embodiment can suppress excessive wear caused by plasma in a plasma generation area. Accordingly, the durability of a semiconductor device fabrication apparatus including the upper electrode according to an embodiment can be improved.

In addition, the thickness of the upper electrode according to an embodiment can vary depending on the radius thereof. Accordingly, the lower surface of the upper electrode according to an embodiment includes a first profile having a first thickness change rate, a third profile having a third thickness change rate, and a fifth profile having a fifth thickness change rate.

In addition, the first profile can have a first thickness change rate of −0.25 to 0, the second profile can have a second thickness change rate of −0.25 to −0.24, the fourth profile can have a fourth thickness change rate of −0.003 to 0.003, the sixth profile can have a sixth thickness change rate of 0.13 to 0.14, and the eighth profile can have an eighth thickness change rate of −0.003 to 0.003.

Accordingly, from the center to the edge, the thickness of the upper electrode according to an embodiment can gradually decrease and then gradually increase again. That is, the lower surface of the upper electrode according to an embodiment can have a profile that gradually becomes thinner and then thicker again while having a convex shape.

Accordingly, the upper electrode according to an embodiment can reinforce plasma in the central portion and edge portion to improve the straightness of the plasma.

Accordingly, the upper electrode according to an embodiment can generate an overall uniform plasma.

In particular, as the diameter of the upper electrode increases, plasma density may be reduced in the central portion and edge portion of the upper electrode. At this time, since the upper electrode includes profiles having the thickness change rates described above, overall uniform plasma can be implemented.

In addition, since the upper electrode according to an embodiment implements overall uniform plasma, generation of residual process by-products can be suppressed. That is, the upper electrode according to an embodiment can prevent adsorption of residual process by-products.

Accordingly, in a process for fabricating a semiconductor device, the upper electrode according to an embodiment can prevent defects such as scratches and chatter marks.

In addition, in the process for fabricating a semiconductor device, since the upper electrode according to an embodiment prevents plasma from concentrating at a specific area, etching of the specific area can be prevented.

Accordingly, the upper electrode according to an embodiment can suppress excessive wear caused by plasma in a plasma generation area. Accordingly, the durability of a semiconductor device fabrication apparatus including the upper electrode according to an embodiment can be improved.

These and other features and advantages of the invention will become apparent from the detailed description of embodiments of the present disclosure and the following figures.

DETAILED DESCRIPTION

Figure 1:
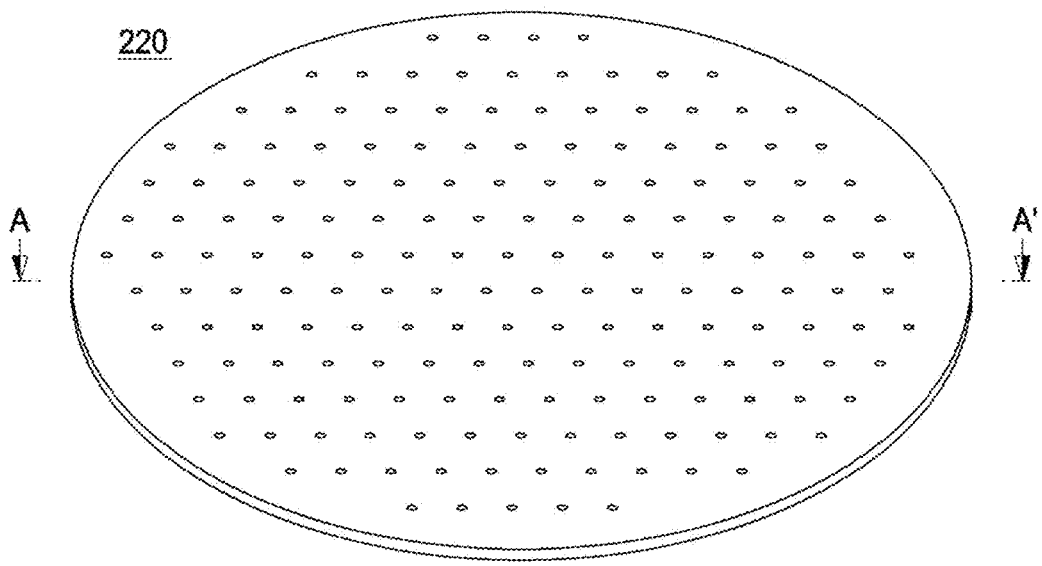
FIG. 1 illustrates an upper electrode according to one embodiment of the present disclosure.

In addition, in the description of elements, it should be understood that when an element or layer is referred to as being "on" or "under" another element or layer, the element or layer can be directly on another element or layer or intervening elements or layers, and criteria for "on" and "under" will be provided based on the drawings. The size of each component in the drawings may be exaggerated for description and does not indicate the actual size.

An upper electrode according to an embodiment may be a component used in an apparatus for fabricating a semiconductor device. That is, the upper electrode may be a component that forms a portion of the semiconductor device fabrication apparatus.

The upper electrode may be a component used in a plasma processing apparatus for fabricating a semiconductor device. The upper electrode may be a component used in a plasma etching apparatus for selectively etching a semiconductor substrate.

The upper electrode may be a component of an upper electrode assembly for spraying plasma.

In addition, the upper electrode may be a component that forms a portion of an assembly that accommodates a wafer and defines a plasma area.

Figure 2:
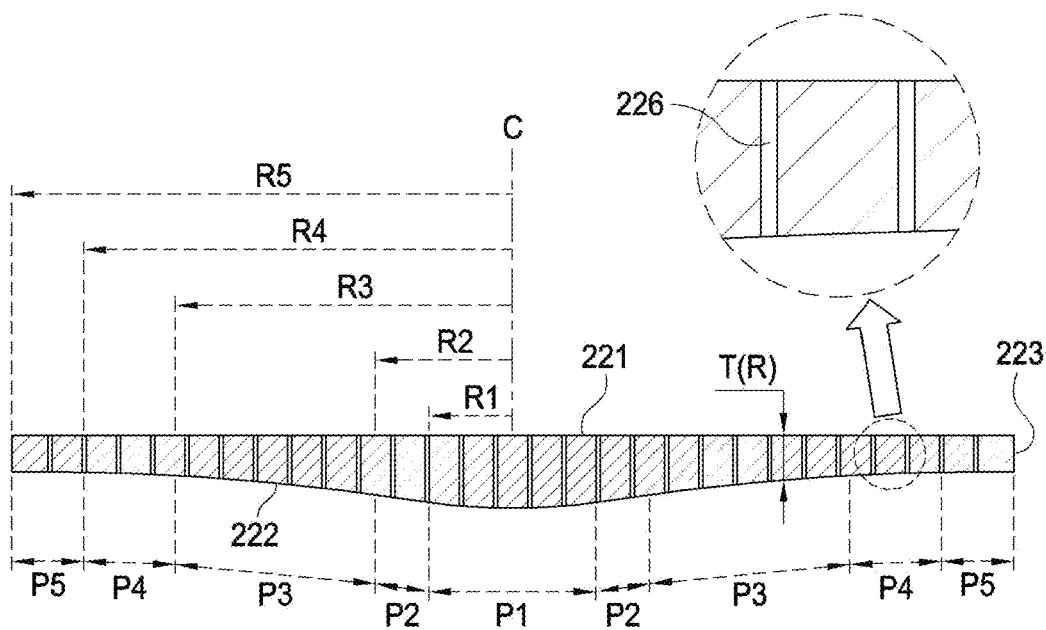
FIG. 2 is a cross-sectional view of an upper electrode according to one embodiment of the present disclosure.

FIG. 1 illustrates an upper electrode according to one embodiment. FIG. 2 is a cross-sectional view of an upper electrode according to one embodiment of the present disclosure.

Referring to FIGS. 1 and 2, an upper electrode 220 according to an embodiment may have a round plate shape. The thickness of the upper electrode 220 according to an embodiment may gradually change in the radius direction.

The upper electrode 220 may include a first upper surface 221, a first lower surface 222, and a first side 223 as shown in FIG. 2.

The first upper surface 221 and the first lower surface 222 are formed to face each other.

The first upper surface 221 may be located in an area where a plasma forming gas flows. The first upper surface 221 may be flat overall. The first upper surface 221 may not substantially include a stepped portion or a curvature.

The first lower surface 222 may be located in a plasma area 114. The first lower surface 222 may include a curvature. The first lower surface 222 may have a curvature in the radius direction. Some portions of the first lower surface 222 may be curved, and other portions may be flat.

The first side 223 extends from the first upper surface 221 to the first lower surface 222. The first side 223 may be an outer circumferential surface of the upper electrode 220.

The upper electrode 220 includes a plurality of through-holes 226. The through-holes 226 are formed to penetrate from the first upper surface 221 to the first lower surface 222. Plasma may be sprayed from the first upper surface 221 to the bottom of the upper electrode 220 through the through-holes 226.

The diameter of the through-holes 226 may be approximately 0.3 mm to approximately 1 mm.

A stepped portion may be formed on the first side 223. That is, a portion of the first side 223 and another portion of the first side 223 may be placed on different planes. Accordingly, the upper electrode 220 may include a stepped portion on the first side 223.

A The stepped portion may be engaged with or coupled to other components of the semiconductor device fabrication apparatus.

A stepped portion may not be formed on the first side 223, and the first side 223 may be flat overall. That is, on the first side 223, a stepped portion may be omitted.

The upper electrode 220 may have a thickness at a certain radius from the center. That is, the thickness from the first upper surface 221 to the first lower surface 222 may be determined according to the radius in a horizontal direction that is flat with the first upper surface 221 from the center.

The thickness direction from the first upper surface 221 to the first lower surface 222 may be perpendicular to the first upper surface 221. The upper electrode 220 may have a line-symmetric structure. That is, the upper electrode 220 may have a line-symmetric structure with respect to a center line (C) passing vertically through the center of the first upper surface 221. In this case, the thickness (T) from the first upper surface 221 to the first lower surface 222 may be the function (T(R)) of the radius (R). That is, the upper electrode 220 may have substantially the same thickness at the same radius.

In addition, the radius (R) is the distance from the center of the first lower surface 222 in the horizontal and radial directions. The horizontal direction may be substantially parallel to the first upper surface 221. In addition, the horizontal direction may be substantially perpendicular to the thickness direction.

In addition, the thickness change rate may be thickness change according to radius change. The thickness change rate may be a value obtained by dividing the thickness change by the radius change. That is, the thickness change rate may be a value obtained by differentiating the thickness by the radius.

The thickness change rate may be calculated by Equation 1 below.

$$dTR=(T1-T2)/(MR1-MR2) \qquad \text{Equation 1}$$

In Equation 1, dTR is a thickness change rate, T1 is a thickness at the radius MR1, and T2 is a thickness at the radius MR2.

The thickness of the upper electrode 220 may be measured using a thickness gauge. In addition, the thickness of the upper electrode 220 may be measured in a vertical direction with respect to the horizontal direction from the first upper surface 221 to the first lower surface 222. The thickness from the first upper surface 221 to the first lower surface 222 may be measured at multiple measurement points. The thickness from the first upper surface 221 to the first lower surface 222 may be measured at a measurement interval of approximately 0.2 mm to approximately 0.4 mm. The spacing between the measurement points may be approximately 0.2 mm to approximately 0.4 mm. The thickness from the first upper surface 221 to the first lower surface 222 may be measured at each measurement interval. The measurement interval may be the radius difference between adjacent measurement points.

In addition, the thickness change rate may be calculated for each measurement interval. That is, the thickness change rate may be calculated between adjacent measurement points. That is, in Equation 1, the MR1-MR2 may be the measurement interval. The MR1-MR2 may be approximately 0.2 mm to approximately 0.4 mm. The measurement interval may be one selected from approximately 0.2 mm, 0.25 mm, 0.3 mm, 0.35 mm, or 0.4 mm.

As shown in FIG. 2, the first lower surface 222 may include a first profile P1, a second profile P2, a third profile P3, a fourth profile P4, and a fifth profile P5.

The first profile P1 may be located in the central area of the first lower surface 222. The first profile P1 may be from the center of the first lower surface 222 to the first radius R1. When viewed from the top, the first profile P1 may have a circular shape. The first profile P1 may correspond to the central area of the first lower surface 222.

The first radius R1 may be approximately 7.5 mm to approximately 9.5 mm. The first radius R1 may be approximately 8 mm to 9 mm.

The first profile P1 may have a first thickness change rate. The first thickness change rate may be the average value of thickness change rates measured at the first profile P1.

The first thickness change rate may be approximately −0.1 to approximately 0. The first thickness change rate may be approximately −0.09 to approximately 0. The first thickness change rate may be approximately −0.085 to approximately 0.

The first thickness change rate may gradually decrease from the center (C) of the first lower surface 222 to the edges of the upper electrode. The first thickness change rate may approach 0 at the center (C) of the first lower surface 222 and may gradually decrease towards the edges of the upper electrode.

In addition, at the first profile P1, at the center (C) of the first lower surface 222, the first thickness change rate may be approximately −0.01 to approximately 0.01. In the first radius R1, the first thickness change rate may be approximately −0.09 to approximately −0.07.

From the center (C) to the first radius R1, the first thickness change rate may gradually decrease from one of approximately −0.01 to approximately 0.01 to one of approximately −0.09 to approximately −0.07.

The second profile P2 is located further outward than the first profile P1. The second profile P2 may surround the first profile P1. The second profile P2 may extend along the periphery of the first profile P1. The second profile P2 may directly contact the edge of the first profile P1. That is, the second profile P2 and the first profile P1 may be directly connected to each other.

When viewed from the top, the second profile P2 may have a ring shape. When viewed from the top, the second profile P2 may have a donut shape.

The second profile P2 may be from the first radius R1 to the second radius R2. The second profile P2 may be an area from the first radius R1 to the second radius R2. The second radius R2 may be larger than the first radius R1.

The second radius R2 may be approximately 11 mm to approximately 14 mm. The second radius R2 may be approximately 12 mm to approximately 13 mm. The second radius R2 may be 12 mm to approximately 12.6 mm.

The second profile P2 may have a second thickness change rate. The second thickness change rate may be the average value of thickness change rates at the second profile P2.

The second thickness change rate may be approximately −0.12 to approximately −0.08. The second thickness change rate may be approximately −0.119 to approximately −0.083. The second thickness change rate may be approximately −0.10 to approximately −0.09.

At the second profile P2, the second thickness change rate may gradually decrease towards the edge. That is, at the second profile P2, the second thickness change rate may have the largest value at the innermost side and the smallest value at the outermost side.

At the first radius R1, the second thickness change rate may be approximately −0.07 to −0.09. At the second radius R2, the second thickness change rate may be approximately −0.115 to approximately −0.122.

The second thickness change rate may gradually decrease from one of approximately −0.07 to −0.09 to one of approximately −0.115 to −0.122 from the first radius R1 to the second radius R2.

The third profile P3 is located outside the second profile P2. The third profile P3 may surround the first profile P1 and the second profile P2. That is, the third profile P3 may extend along the periphery of the first profile P1. The third profile P3 may extend along the periphery of the second profile P2. The third profile P3 may directly contact the edge of the second profile P2. That is, the third profile P3 and the second profile P2 may be directly connected to each other.

The third profile P3 may be from the second radius R2 to a third radius R3. That is, the third profile P3 may be an area from the second radius R2 to the third radius R3. The third radius R3 may be larger than the second radius R2.

The third radius R3 may be approximately 54 mm to approximately 60 mm. The third radius R3 may be approximately 55 mm to approximately 59 mm. The third radius R3 may be approximately 56.5 mm to approximately 58.5 mm.

The third profile P3 may have a third thickness change rate. The third thickness change rate may be the average value of thickness change rates at the third profile P3.

The third thickness change rate may be approximately −0.115 to approximately −0.122. The third thickness change rate may be approximately −0.116 to approximately −0.121. The third thickness change rate may be approximately −0.117 to approximately −0.120.

At the third profile P3, the third thickness change rate may be constant overall. That is, at the third profile P3, the third thickness change rate may have a small deviation. The deviation of the third thickness change rate may be less than 0.006. The deviation of the third thickness change rate may be less than 0.005. The deviation of the third thickness change rate may be less than 0.004.

At the second radius R2, the third thickness change rate may be approximately −0.115 to −0.122. At the third radius R3, the third thickness change rate may be approximately −0.115 to approximately −0.122.

The fourth profile P4 is located outside the third profile P3. The fourth profile P4 may surround the first profile P1, the second profile P2, and the third profile P3. That is, the fourth profile P4 may extend along the periphery of the first profile P1. The fourth profile P4 may extend along the periphery of the second profile P2. The fourth profile P4 may extend along the periphery of the third profile P3. The fourth profile P4 may directly contact the edge of the third profile P3. That is, the fourth profile P4 and the third profile P3 may be directly connected to each other.

The fourth profile P4 may be from the third radius R3 to a fourth radius R4. That is, the fourth profile P4 may be an area from the third radius R3 to the fourth radius R4. The fourth radius R4 may be larger than the third radius R3.

The fourth radius R4 may be approximately 86 mm to approximately 92 mm. The fourth radius R4 may be approximately 87 mm to approximately 91 mm. The fourth radius R4 may be approximately 87 mm to approximately 90 mm.

The fourth profile P4 may have a fourth thickness change rate. The fourth thickness change rate may be the average value of thickness change rates at the fourth profile P4.

The fourth thickness change rate may be approximately −0.121 to approximately 0. The fourth thickness change rate may be approximately −0.120 to approximately 0. The fourth thickness change rate may be approximately −0.120 to approximately 0.003. The fourth thickness change rate may be approximately −0.08 to approximately −0.03.

At the fourth profile P4, the fourth thickness change rate may gradually increase towards the edge.

At the third radius R3, the fourth thickness change rate may be approximately −0.115 to −0.122. At the fourth radius R4, the fourth thickness change rate may be approximately −0.01 to approximately 0.01.

The fourth thickness change rate may gradually increase from one of approximately −0.115 to −0.122 to one of approximately −0.01 to 0.01 from the third radius R3 to the fourth radius R4.

The fifth profile P5 is located outside the fourth profile P4. The fifth profile P5 may surround the first profile P1, the second profile P2, the third profile P3, and the fourth profile P4. That is, the second profile P2 may extend along the periphery of the first profile P1. The third profile P3 may extend along the periphery of the second profile P2. The fourth profile P4 may extend along the periphery of the third profile P3. The fifth profile P5 may extend along the periphery of the fourth profile P4. The fifth profile P5 may directly contact the edge of the fourth profile P4. That is, the fifth profile P5 and the fourth profile P4 may be directly connected to each other.

The fifth profile P5 may be from the fourth radius R4 to a fifth radius R5. That is, the fifth profile P5 may be an area from the fourth radius R4 to the fifth radius R5. The fifth radius R5 may be larger than the fourth radius R4. In addition, the fifth radius R5 may be the edge of the upper electrode 220.

The fifth radius R5 may be approximately 98 mm to approximately 105 mm. The fifth radius R5 may be approximately 98 mm to approximately 102 mm. The fifth radius R5 may be approximately 98 mm to approximately 100 mm.

The fifth profile P5 may have a fifth thickness change rate.

The fifth thickness change rate may be approximately −0.005 to approximately 0.005. The fifth thickness change rate may be approximately −0.003 to approximately 0.003. The fifth thickness change rate may be approximately −0.002 to approximately 0.002.

At the fifth profile P5, the fifth thickness change rate may be constant overall. That is, at the fifth profile P5, the fifth thickness change rate may have a small deviation. The deviation of the fifth thickness change rate may be less than 0.006. The deviation of the fifth thickness change rate may be less than 0.005. The deviation of the fifth thickness change rate may be less than 0.003.

At the center of the first lower surface 222, the thickness may be approximately 14 mm to approximately 20 mm. At the center of the first lower surface 222, the thickness may be approximately 15 mm to approximately 17 mm.

At the fifth profile P5, the thickness may be approximately 6 mm to approximately 10 mm. At the fifth profile P5, the thickness may be approximately 7 mm to approximately 9 mm.

In addition, the full radius of the upper electrode 220 may be substantially equal to that of the fifth radius R5. The full radius of the upper electrode 220 may be approximately 98 mm to approximately 106 mm.

In addition, a value obtained by dividing the first radius R1 by the full radius of the upper electrode 220 may be 0.075 to 0.095. A value obtained by dividing the second radius R2 by the full radius of the upper electrode 220 may be 0.11 to 0.14. A value obtained by dividing the third radius R3 by the full radius of the upper electrode 220 may be 0.48 to 0.54. A value obtained by dividing the fourth radius R4 by the full radius of the upper electrode 220 may be 0.88 to 0.92. A value obtained by dividing the fifth radius R5 by the full radius of the upper electrode 220 may be 0.97 to 1.

The deviation may be an absolute value of the difference between a thickness change rate and an average value at each location.

In addition, the upper electrode 220 may further include a fastening groove (not shown) formed for fastening with other components. The thickness of the upper electrode 220 may be measured while ignoring the fastening groove. That is, when measuring the thickness of the upper electrode 220, the fastening groove is filled.

As described above, the thickness of the upper electrode 220 according to an embodiment may vary depending on the radius. Accordingly, the first profile P1, the second profile P2, the third profile P3, the fourth profile P4, and the fifth profile P5 may have a thickness change rate within the above-described range.

Accordingly, the thickness of the upper electrode 220 according to an embodiment may gradually decrease from the center to the edge. That is, the lower surface of the upper electrode 220 according to an embodiment may have a profile that is appropriately thin while having a convex shape at the center. In addition, the fifth profile P5 may have an appropriate width and an overall flat shape.

Accordingly, the upper electrode 220 according to an embodiment may suppress plasma from gathering in the central portion and appropriately guide plasma to the edge.

Accordingly, the upper electrode 220 according to an embodiment may generate an overall uniform plasma.

The upper electrode 220 according to an embodiment may properly guide plasma from the center to the edge. That is, the upper electrode 220 according to an embodiment may form overall uniform plasma and impart high straightness to the plasma.

Accordingly, the upper electrode 220 may proceed with an etching process with a uniform thickness. That is, a semiconductor device fabrication apparatus equipped with the upper electrode 220 may uniformly control the etching thickness of a semiconductor substrate.

In addition, the upper electrode 220 according to an embodiment may suppress generation of residual process by-products. That is, the upper electrode 220 according to an embodiment may prevent adsorption of residual process by-products.

Accordingly, in a process for fabricating a semiconductor device, the upper electrode 220 according to an embodiment may prevent defects such as scratches and chatter marks.

Figure 3:
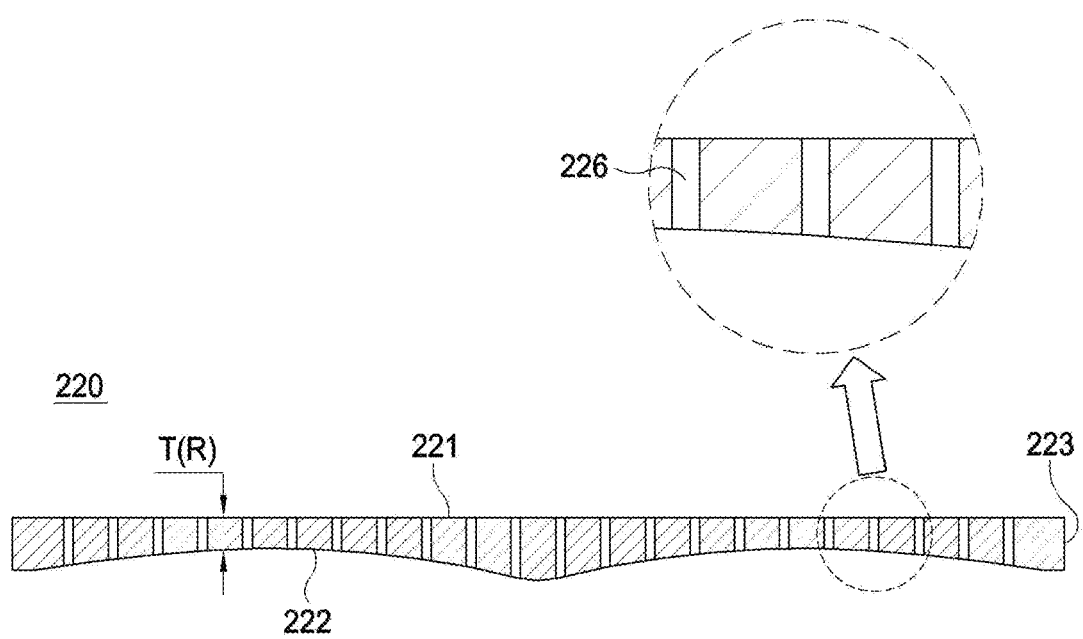
FIG. 3 is a cross-sectional view of an upper electrode according to another embodiment of the present disclosure.
Figure 4:
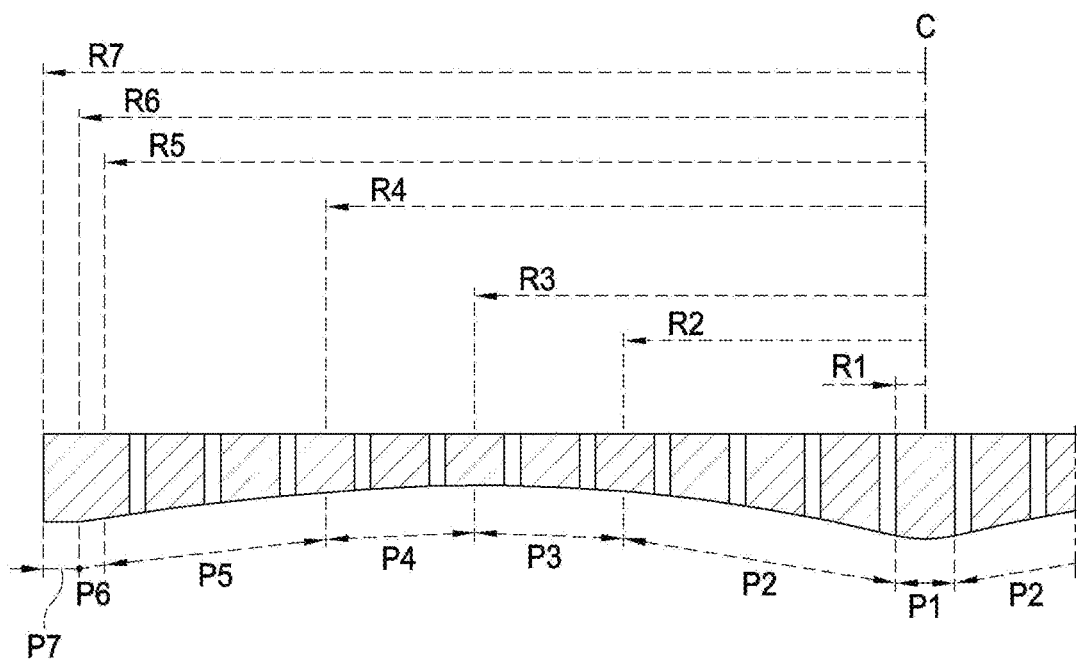
FIG. 4 is an enlarged cross-sectional view of the upper electrode according to another embodiment of the present disclosure.

FIG. 3 is a cross-sectional view of an upper electrode according to another embodiment of the present disclosure. FIG. 4 is an enlarged cross-sectional view of the upper electrode according to another embodiment of the present disclosure.

As shown in FIGS. 3 and 4, the first lower surface 222 may include the first profile P1, the second profile P2, the third profile P3, the fourth profile P4, the fifth profile P5, a sixth profile P6, and a seventh profile P7.

The first profile P1 may be located in the central area of the first lower surface 222. The first profile P1 may be from the center of the first lower surface 222 to the first radius R1. When viewed from the top, the first profile P1 may have a circular shape. The first profile P1 may correspond to the central area of the first lower surface 222.

The first radius R1 may be approximately 3 mm to approximately 5 mm. The first radius R1 may be approximately 3.5 mm to 4.5 mm.

The first profile P1 may have a first thickness change rate. Here, the first thickness change rate may be the average value of thickness change rates measured at the first profile P1.

The first thickness change rate may be approximately −0.385 to approximately 0. The first thickness change rate may be approximately −0.30 to approximately −0.1. The first thickness change rate may be approximately −0.25 to approximately −0.15.

The first thickness change rate may gradually decrease from the center of the first lower surface 222 to the edge. Within the range of approximately −0.385 to approximately 0, the first thickness change rate may gradually decrease from the center of the lower surface towards the edge.

The first thickness change rate may approach 0 at the center of the first lower surface 222, and may gradually decrease towards the edge. In addition, in the first profile P1, at the center of the first lower surface 222, the first thickness change rate may be approximately −0.01 to approximately 0.01. At the first radius R1, the first thickness change rate may be approximately −0.36 to approximately −0.39.

The first thickness change rate may gradually decrease from one of approximately −0.01 to approximately 0.01 to one of approximately −0.36 to approximately −0.39 from the center to the first radius R1.

The second profile P2 is located further outward than the first profile P1. The second profile P2 may surround the first profile P1. The second profile P2 may extend along the periphery of the first profile P1. The second profile P2 may directly contact the edge of the first profile P1. That is, the second profile P2 and the first profile P1 may be directly connected to each other.

When viewed from the top, the second profile P2 may have a ring shape. When viewed from the top, the second profile P2 may have a donut shape.

The second profile P2 may be from the first radius R1 to the second radius R2. The second profile P2 may be an area from the first radius R1 to the second radius R2. The second radius R2 may be larger than the first radius R1.

The second radius R2 may be approximately 8 mm to approximately 10 mm. The second radius R2 may be approximately 8.5 mm to approximately 9.5 mm.

The width of the second profile P2 may be approximately 3 mm to approximately 7 mm.

The second profile P2 may have the second thickness change rate. The second thickness change rate may be the average value of thickness change rates at the second profile P2.

The second thickness change rate may be approximately −0.37 to approximately −0.39. The second thickness change rate may be approximately −0.375 to approximately −0.385.

At the second profile P2, the second thickness change rate may be nearly constant. That is, at the second profile P2, the second thickness change rate may have substantially similar values at the innermost and outermost sides.

At the first radius R1, the second thickness change rate may be approximately −0.37 to −0.39. At the second radius R2, the second thickness change rate may be approximately −0.37 to approximately −0.39.

The third profile P3 is located outside the second profile P2. The third profile P3 may surround the first profile P1 and the second profile P2. That is, the third profile P3 may extend along the periphery of the first profile P1. The third profile P3 may extend along the periphery of the second profile P2. The third profile P3 may directly contact the edge of the second profile P2. That is, the third profile P3 and the second profile P2 may be directly connected to each other.

The third profile P3 may be from the second radius R2 to the third radius R3. That is, the third profile P3 may be an area from the second radius R2 to the third radius R3. The third radius R3 may be larger than the second radius R2.

The third radius R3 may be approximately 75 mm to approximately 85 mm. The third radius R3 may be approximately 77 mm to approximately 83 mm. The third radius R3 may be approximately 78 mm to approximately 82 mm.

The width of the third profile may be approximately 65 mm to approximately 78 mm. The width of the third profile may be approximately 67 mm to approximately 76 mm. The width of the third profile may be approximately 68 mm to approximately 75 mm.

The third profile P3 may have a third thickness change rate. The third thickness change rate may be the average value of thickness change rates at the third profile P3.

The third thickness change rate may be approximately −0.385 to approximately 0. The third thickness change rate may be approximately −0.3 to approximately −0.1. The third thickness change rate may be approximately −0.25 to approximately −0.15.

At the third profile P3, as the radius increases, the third thickness change rate may gradually increase. That is, the third thickness change rate may gradually increase from the second radius R2 to the third radius R3. The third thickness change rate may gradually increase from the center of the lower surface to the edge. Within the range of approximately −0.385 to approximately 0, the third thickness change rate may gradually increase from the center of the lower surface to the edge.

At the second radius R2, the third thickness change rate may be approximately −0.37 to approximately −0.38. At the third radius R3, the third thickness change rate may be approximately −0.003 to approximately 0.003.

The third thickness change rate may gradually increase from one of approximately −0.37 to approximately −0.38 to one of approximately −0.003 to approximately 0.003 from the second radius R2 to the third radius R3.

The fourth profile P4 is located outside the third profile P3. The fourth profile P4 may surround the first profile P1, the second profile P2, and the third profile P3. That is, the fourth profile P4 may extend along the periphery of the first profile P1. The fourth profile P4 may extend along the periphery of the second profile P2. The fourth profile P4 may extend along the periphery of the third profile P3. The fourth profile P4 may directly contact the edge of the third profile P3. That is, the fourth profile P4 and the third profile P3 may be directly connected to each other.

The fourth profile P4 may be from the third radius R3 to the fourth radius R4. That is, the fourth profile P4 may be an area from the third radius R3 to the fourth radius R4. The fourth radius R4 may be larger than the third radius R3.

The fourth radius R4 may be approximately 108 mm to approximately 114 mm. The fourth radius R4 may be approximately 109 mm to approximately 113 mm. The fourth radius R4 may be 110 mm to approximately 112 mm.

The fourth profile P4 may have the fourth thickness change rate.

The fourth thickness change rate may be approximately 0 to approximately 0.105. The fourth thickness change rate may be approximately 0.02 to approximately 0.8. The fourth thickness change rate may be approximately 0.03 to approximately 0.07.

At the fourth profile P4, as the radius increases, the fourth thickness change rate may gradually increase. The fourth thickness change rate may gradually increase from the third radius R3 to the fourth radius R4. Within the range of approximately 0 to approximately 0.105, the fourth thickness change rate may gradually increase from the center of the lower surface to the edge.

At the third radius R3, the fourth thickness change rate may be approximately −0.003 to approximately 0.003. At the fourth radius R4, the fourth thickness change rate may be approximately 0.1 to approximately 0.11.

That is, the fourth thickness change rate may gradually increase from one of approximately −0.003 to approximately 0.003 to one of approximately 0.1 to approximately 0.11 from the third radius R3 to the fourth radius R4.

The fifth profile P5 is located outside the fourth profile P4. The fifth profile P5 may surround the first profile P1, the second profile P2, the third profile P3, and the fourth profile P4. That is, the fifth profile P5 may extend along the periphery of the first profile P1. The fifth profile P5 may extend along the periphery of the second profile P2. The fifth profile P5 may extend along the periphery of the third profile P3. The fifth profile P5 may extend along the periphery of the fourth profile P4. The fifth profile P5 may directly contact the edge of the fourth profile P4. That is, the fifth profile P5 and the fourth profile P4 may be directly connected to each other.

The fifth profile P5 may be from the fourth radius R4 to the fifth radius R5. That is, the fifth profile P5 may be an area from the fourth radius R4 to the fifth radius R5. The fifth radius R5 may be larger than the fourth radius R4.

The fifth radius R5 may be approximately 137 mm to approximately 142 mm. The fifth radius R5 may be approximately 138 mm to approximately 141 mm. The fifth radius R5 may be approximately 138.5 mm to approximately 140.5 mm.

The width of the fifth profile P5 may be approximately 24 mm to approximately 33 mm. The width of the fifth profile P5 may be approximately 26 mm to approximately 31 mm. The width of the fifth profile P5 may be approximately 27 mm to approximately 30 mm.

The fifth profile P5 may have the fifth thickness change rate. The fourth thickness change rate may be the average value of thickness change rates at the fifth profile P5.

The fifth thickness change rate may be approximately 0.1 to approximately 0.11. The fourth thickness change rate may be approximately 0.102 to approximately 0.108.

At the fourth radius R4, the fifth thickness change rate may be approximately 0.1 to approximately 0.11. At the fifth radius R5, the fifth thickness change rate may be approximately 0.1 to approximately 0.11.

At the fifth profile P5, the fifth thickness change rate may be constant overall. That is, at the fifth profile P5, the fifth thickness change rate may have a small deviation. The deviation of the fifth thickness change rate may be less than 0.01. The deviation of the fifth thickness change rate may be less than 0.007. The deviation of the fifth thickness change rate may be less than 0.005.

The sixth profile P6 is located further outward than the fifth profile P5. The sixth profile P6 may surround the fifth profile P5. The sixth profile P6 may extend along the periphery of the fifth profile P5. The sixth profile P6 may directly contact the edge of the fifth profile P5. That is, the sixth profile P6 and the fifth profile P5 may be directly connected to each other.

When viewed from the top, the sixth profile P6 may have a ring shape. When viewed from the top, the sixth profile P6 may have a donut shape.

The sixth profile P6 may be from the fifth radius R5 to a sixth radius R6. The sixth profile P6 may be an area from the fifth radius R5 to the sixth radius R6. The sixth profile P6 may be larger than the fifth radius R5.

The sixth radius R6 may be approximately 140 mm to approximately 142 mm. The sixth radius R6 may be approximately 140.5 mm to approximately 141.5 mm.

The width of the sixth profile P6 may be approximately 1 mm to approximately 1.5 mm.

The sixth profile P6 may have a sixth thickness change rate. The sixth thickness change rate may be the average value of thickness change rates at the sixth profile P6.

The sixth thickness change rate may be approximately 0 to approximately 0.1. The sixth thickness change rate may be approximately 0.02 to approximately 0.08. The sixth thickness change rate may be approximately 0.03 to approximately 0.07.

At the sixth profile P6, the sixth thickness change rate may gradually decrease from the fifth radius R5 to the sixth radius R6. At the sixth profile P6, within the range of 0 to 0.1, the sixth thickness change rate may gradually decrease from the innermost side to the outermost side.

At the fifth radius R5, the sixth thickness change rate may be approximately 0.1 to approximately 0.11. At the sixth radius R6, the sixth thickness change rate may be approximately −0.003 to approximately 0.003.

That is, the sixth thickness change rate may gradually decrease from one of approximately 0.1 to approximately 0.11 to one of approximately −0.003 to approximately 0.003 from the fifth radius R5 to the sixth radius R6.

The seventh profile P7 is located outside the sixth profile P6. The seventh profile P7 may surround the first profile P1, the second profile P2, the third profile P3, the fourth profile P4, and the fifth profile P5. That is, the seventh profile P7 may extend along the periphery of the first profile P1. The seventh profile P7 may extend along the periphery of the second profile P2. The seventh profile P7 may extend along the periphery of the third profile P3. The seventh profile P7 may extend along the periphery of the fourth profile P4. The seventh profile P7 may extend along the periphery of the fifth profile P5. The seventh profile P7 may extend along the periphery of the sixth profile P6. The seventh profile P7 may directly contact the edge of the sixth profile P6. That is, the seventh profile P7 and the seventh profile P7 may be directly connected to each other.

The seventh profile P7 may be from the sixth radius R6 to a seventh radius R7. That is, the seventh profile P7 may be an area from the sixth radius R6 to the seventh radius R7. The seventh radius R7 may be larger than the sixth radius R6.

The seventh radius R7 may be approximately 144.5 mm to approximately 155 mm. The seventh radius R7 may be approximately 145 mm to approximately 152 mm.

The seventh profile P7 may have a seventh thickness change rate.

The seventh thickness change rate may be approximately −0.005 to approximately 0.005. The seventh thickness change rate may be approximately −0.003 to approximately 0.003. The seventh thickness change rate may be approximately −0.002 to approximately 0.002.

At the seventh profile P7, the seventh thickness change rate may be constant overall. The seventh thickness change rate may be constant overall from the sixth radius R6 to the seventh radius R7. At the seventh profile P7, the deviation of the seventh thickness change rate may be less than 0.005. At the seventh profile P7, the deviation of the seventh thickness change rate may be less than 0.003. At the seventh profile P7, the deviation of the seventh thickness change rate may be less than 0.002.

At the sixth radius R6, the seventh thickness change rate may be approximately −0.003 to approximately 0.003. At the seventh radius R7, the seventh thickness change rate may be approximately −0.003 to approximately 0.003.

At the center of the first lower surface 222, the thickness may be approximately 20 mm to approximately 28 mm. At the center of the first lower surface 222, the thickness may be approximately 22 mm to approximately 25 mm.

In the area where the third profile and the fourth profile P4 meet, the thickness may be approximately 9 mm to approximately 12 mm. In the area where the third profile and the fourth profile P4 meet, the thickness may be approximately 8 mm to approximately 13 mm.

At the seventh profile P7, the thickness may be approximately 11 mm to approximately 16 mm. At the seventh profile P7, the thickness may be approximately 10 mm to approximately 17 mm.

In addition, the full radius of the upper electrode 220 may be substantially equal to that of the seventh radius R7. The full radius of the upper electrode 220 may be approximately 144 mm to approximately 155 mm.

The deviation may be an absolute value of the difference between a thickness change rate and an average value at each location.

In addition, a value obtained by dividing the first radius R1 by the full radius of the upper electrode 220 may be 0.015 to 0.035. A value obtained by dividing the second radius R2 by the full radius of the upper electrode 220 may be 0.05 to 0.07. A value obtained by dividing the third radius R3 by the full radius of the upper electrode 220 may be 0.5 to 0.57. A value obtained by dividing the fourth radius R4 by the full radius of the upper electrode 220 may be 0.72 to 0.76. A value obtained by dividing the fifth radius R5 by the full radius of the upper electrode 220 may be 0.92 to 0.94. A value obtained by dividing the sixth radius R6 by the full radius of the upper electrode 220 may be 0.935 to 0.955.

At the first, second, and third profiles, the thickness may gradually decrease from the center to the edge. In addition, at the fourth, fifth, and sixth profiles, the thickness may gradually increase from the center to the edge.

That is, the first thickness change rate, the second thickness change rate, and the third thickness change rate may be less than 0, and the fourth thickness change rate, the fifth thickness change rate, and the sixth thickness change rate may be greater than 0.

A sum of the width of the first profile, the width of the second profile, and the width of the third profile may be approximately 75 mm to approximately 85 mm. A sum of the width of the fourth profile, the width of the fifth profile, and the width of the sixth profile may be approximately 62 mm to approximately 67 mm. The sum of the width of the first profile, the width of the second profile, and the width of the third profile may be greater than the sum of the width of the fourth profile, the width of the fifth profile, and the width of the sixth profile.

The ratio of the sum of the width of the first profile, the width of the second profile, and the width of the third profile to the sum of the width of the fourth profile, the width of the fifth profile, and the width of the sixth profile may be approximately 51:49 to approximately 59:41.

In addition, the upper electrode 220 may further include a fastening groove (not shown) formed for fastening with other components. The thickness of the upper electrode 220 may be measured while ignoring the fastening groove. That is, when measuring the thickness of the upper electrode 220, the fastening groove is filled.

As described above, the thickness of the upper electrode 220 according to an embodiment may vary depending on the radius. Accordingly, the first profile P1, the second profile P2, the third profile P3, the fourth profile P4, the fifth profile P5, the sixth profile P6, and the seventh profile P7 may have a thickness change rate within the above-described range.

Accordingly, in the upper electrode 220 according to an embodiment, from the center to the edge, the thickness may gradually decrease and then may gradually increase. That is, the lower surface of the upper electrode 220 according to an embodiment may have a profile that gradually becomes thinner and then thicker again while having a convex shape at the center. In addition, the seventh profile P7 may have an appropriate width and an overall flat shape.

Accordingly, the upper electrode 220 according to an embodiment may guide plasma to the edge while collecting the plasma in the central portion.

Accordingly, the upper electrode 220 according to an embodiment may generate an overall uniform plasma.

The upper electrode 220 according to an embodiment may properly guide plasma from the center to the edge. That is, the upper electrode 220 according to an embodiment may form overall uniform plasma and impart high straightness to the plasma.

Accordingly, the upper electrode 220 may proceed with an etching process with a uniform thickness. That is, a semiconductor device fabrication apparatus equipped with the upper electrode 220 may uniformly control the etching thickness of a semiconductor substrate.

In addition, the upper electrode 220 according to an embodiment may suppress generation of residual process by-products. That is, the upper electrode 220 according to an embodiment may prevent adsorption of residual process by-products.

Accordingly, in a process for fabricating a semiconductor device, the upper electrode 220 according to an embodiment may prevent defects such as scratches and chatter marks.

Figure 5:
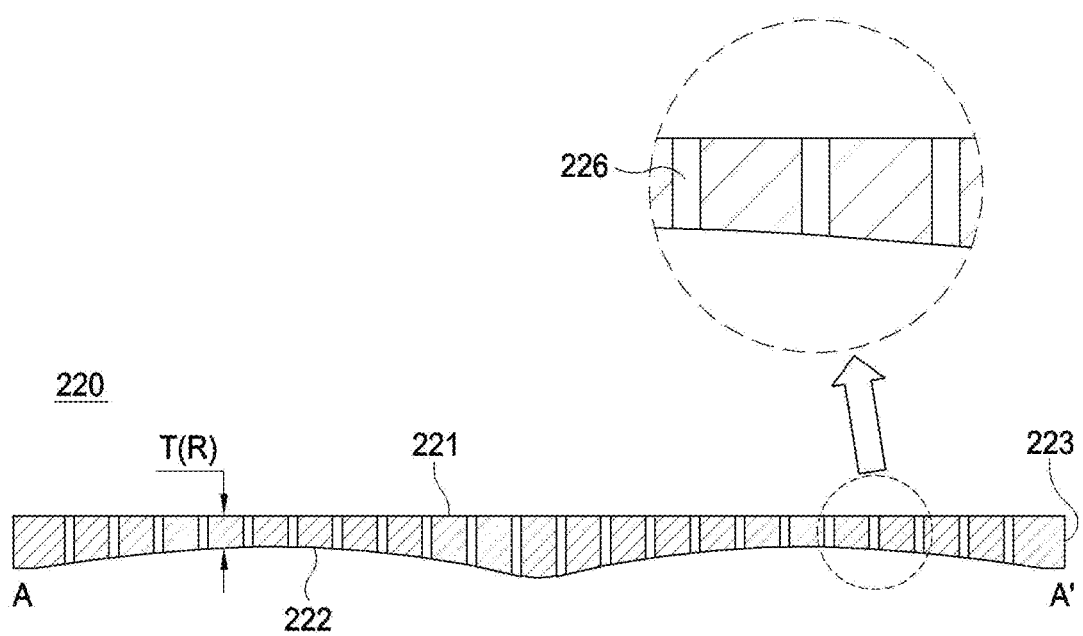
FIG. 5 is a cross-sectional view of an upper electrode according to another embodiment of the present disclosure.
Figure 6:
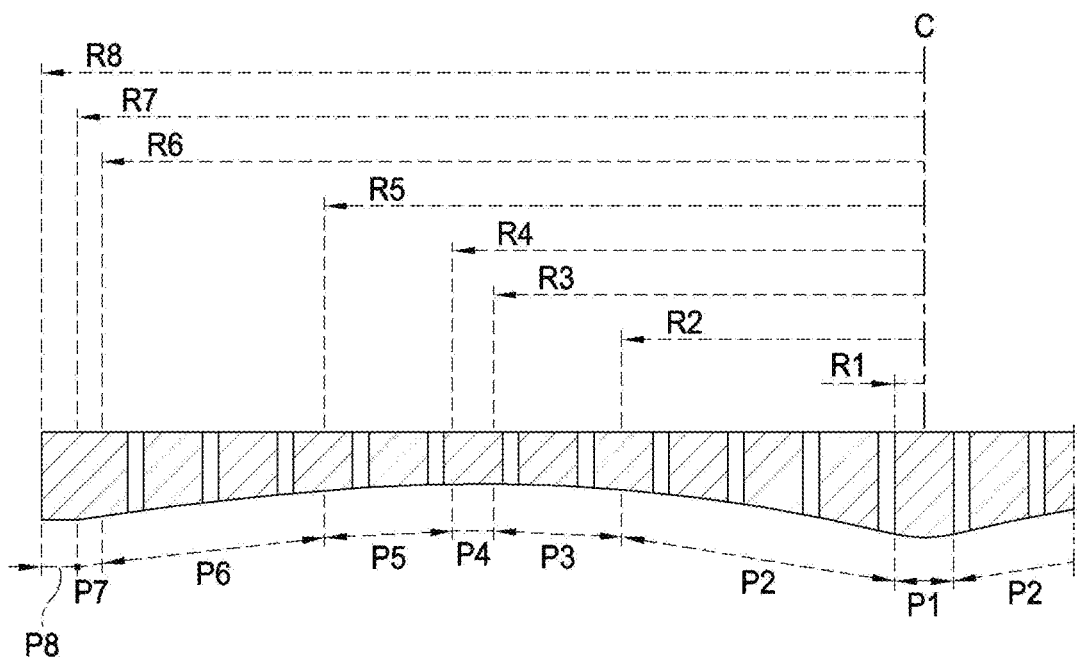
FIG. 6 is an enlarged cross-sectional view of the upper electrode according to another embodiment of the present disclosure.

FIG. 5 is a cross-sectional view of an upper electrode according to another embodiment of the present disclosure. FIG. 6 is an enlarged cross-sectional view of the upper electrode according to another embodiment of the present disclosure.

As shown in FIGS. 5 and 6, the first lower surface 222 may include the first profile P1, the second profile P2, the third profile P3, the fourth profile P4, the fifth profile P5, the sixth profile P6, the seventh profile P7, and an eighth profile P8.

The first profile P1 may be located in the central area of the first lower surface 222. The first profile P1 may be from the center of the first lower surface 222 to the first radius R1. When viewed from the top, the first profile P1 may have a circular shape. The first profile P1 may correspond to the central area of the first lower surface 222.

The first radius R1 may be approximately 3 mm to approximately 5 mm. The first radius R1 may be approximately 3.5 mm to 4.5 mm.

The first profile P1 may have the first thickness change rate. Here, the first thickness change rate may be the average value of thickness change rates measured at the first profile P1.

The first thickness change rate may be approximately −0.25 to approximately 0. The first thickness change rate may be approximately −0.20 to approximately 0. The first thickness change rate may be approximately −0.15 to approximately 0.

The first thickness change rate may gradually decrease from the center of the first lower surface 222 to the edge. The first thickness change rate may approach 0 at the center of the first lower surface 222, and may gradually decrease towards the edge.

In addition, in the first profile P1, at the center of the first lower surface 222, the first thickness change rate may be approximately −0.01 to approximately 0.01. At the first radius R1, the first thickness change rate may be approximately −0.25 to approximately −0.23.

That is, the first thickness change rate may gradually decrease from one of approximately −0.01 to approximately 0.01 to one of approximately −0.25 to approximately −0.23 from the center to the first radius R1.

The second profile P2 is located further outward than the first profile P1. The second profile P2 may surround the first profile P1. The second profile P2 may extend along the periphery of the first profile P1. The second profile P2 may directly contact the edge of the first profile P1. That is, the second profile P2 and the first profile P1 may be directly connected to each other.

When viewed from the top, the second profile P2 may have a ring shape. When viewed from the top, the second profile P2 may have a donut shape.

The second profile P2 may be from the first radius R1 to the second radius R2. The second profile P2 may be an area from the first radius R1 to the second radius R2. The second radius R2 may be larger than the first radius R1.

The second radius R2 may be approximately 16 mm to approximately 19 mm. The second radius R2 may be approximately 17 mm to approximately 18.5 mm. The second radius R2 may be approximately 17 mm to approximately 18 mm.

The width of the second profile P2 may be approximately 12 mm to approximately 16 mm.

The second profile P2 may have the second thickness change rate. The second thickness change rate may be the average value of thickness change rates at the second profile P2.

The second thickness change rate may be approximately −0.26 to approximately −0.23. The second thickness change rate may be approximately −0.25 to approximately −0.24. The second thickness change rate may be approximately −0.248 to approximately −0.242.

At the second profile P2, the second thickness change rate may be nearly constant. That is, at the second profile P2, the second thickness change rate may have substantially similar values at the innermost and outermost sides.

At the first radius R1, the second thickness change rate may be approximately −0.26 to approximately −0.22. At the second radius R2, the second thickness change rate may be approximately −0.26 to approximately −0.22.

The third profile P3 is located outside the second profile P2. The third profile P3 may surround the first profile P1 and the second profile P2. That is, the third profile P3 may extend along the periphery of the first profile P1. The third profile P3 may extend along the periphery of the second profile P2. The third profile P3 may directly contact the edge of the second profile P2. That is, the third profile P3 and the second profile P2 may be directly connected to each other.

The third profile P3 may be from the second radius R2 to the third radius R3. That is, the third profile P3 may be an area from the second radius R2 to the third radius R3. The third radius R3 may be larger than the second radius R2.

The third radius R3 may be approximately 69 mm to approximately 71 mm. The third radius R3 may be approximately 68 mm to approximately 72 mm. The third radius R3 may be approximately 69.5 mm to approximately 70.7 mm.

The third profile P3 may have a third thickness change rate. The third thickness change rate may be the average value of thickness change rates at the third profile P3.

The third thickness change rate may be approximately −0.2 to approximately −0.05. The third thickness change rate may be approximately −0.16 to approximately −0.08. The third thickness change rate may be approximately −0.15 to approximately −0.1.

At the third profile P3, as the radius increases, the third thickness change rate may gradually increase. That is, the third thickness change rate may gradually increase from the second radius R2 to the third radius R3.

At the second radius R2, the third thickness change rate may be approximately −0.26 to approximately −0.22. At the third radius R3, the third thickness change rate may be approximately −0.006 to approximately 0.

The third thickness change rate may gradually increase from one of approximately −0.26 to approximately −0.22 to one of approximately −0.006 to approximately 0 from the second radius R2 to the third radius R3.

The fourth profile P4 is located outside the third profile P3. The fourth profile P4 may surround the first profile P1, the second profile P2, and the third profile P3. That is, the fourth profile P4 may extend along the periphery of the first profile P1. The fourth profile P4 may extend along the periphery of the second profile P2. The fourth profile P4 may extend along the periphery of the third profile P3. The fourth profile P4 may directly contact the edge of the third profile P3. That is, the fourth profile P4 and the third profile P3 may be directly connected to each other.

The fourth profile P4 may be from the third radius R3 to the fourth radius R4. That is, the fourth profile P4 may be an area from the third radius R3 to the fourth radius R4. The fourth radius R4 may be larger than the third radius R3.

The fourth radius R4 may be approximately 74 mm to approximately 76 mm. The fourth radius R4 may be approximately 74.3 mm to approximately 75.5 mm. The fourth radius R4 may be 74.5 mm to approximately 75.3 mm.

The fourth profile P4 may have the fourth thickness change rate. The fourth thickness change rate may be the average value of thickness change rates at the fourth profile P4.

The fourth thickness change rate may be approximately −0.003 to approximately 0.003. The fourth thickness change rate may be approximately −0.002 to approximately 0.002.

At the third radius R3, the fourth thickness change rate may be approximately −0.003 to approximately 0. At the fourth radius R4, the fourth thickness change rate may be approximately −0.003 to approximately 0.003.

At the fourth profile P4, the fourth thickness change rate may be constant overall. That is, at the fourth profile P4, the fourth thickness change rate may have a small deviation. The deviation of the fourth thickness change rate may be less than 0.006. The deviation of the fourth thickness change rate may be less than 0.005. The deviation of the fourth thickness change rate may be less than 0.003.

The fifth profile P5 is located outside the fourth profile P4. The fifth profile P5 may surround the first profile P1, the second profile P2, the third profile P3, and the fourth profile P4. That is, the fifth profile P5 may extend along the periphery of the first profile P1. The fifth profile P5 may extend along the periphery of the second profile P2. The fifth profile P5 may extend along the periphery of the third profile P3. The fifth profile P5 may extend along the periphery of the fourth profile P4. The fifth profile P5 may directly contact the edge of the fourth profile P4. That is, the fifth profile P5 and the fourth profile P4 may be directly connected to each other.

The fifth profile P5 may be from the fourth radius R4 to the fifth radius R5. That is, the fifth profile P5 may be an area from the fourth radius R4 to the fifth radius R5. The fifth radius R5 may be larger than the fourth radius R4.

The fifth radius R5 may be approximately 106 mm to approximately 108 mm. The fifth radius R5 may be approximately 106.5 mm to approximately 107.7 mm. The fifth radius R5 may be approximately 106.8 mm to approximately 107.5 mm.

The fifth profile P5 may have the fifth thickness change rate.

The fifth thickness change rate may be approximately 0 to approximately 0.12. The fifth thickness change rate may be approximately 0.03 to approximately 0.1. The fifth thickness change rate may be approximately 0.04 to approximately 0.08.

At the fifth profile P5, as the radius increases, the fifth thickness change rate may gradually increase. The fifth thickness change rate may gradually increase from the fourth radius R4 to the fifth radius R5.

At the fourth radius R4, the fifth thickness change rate may be approximately −0.003 to approximately 0.003. At the fifth radius R5, the fifth thickness change rate may be approximately 0.125 to approximately 0.132.

The fifth thickness change rate may gradually increase from one of approximately −0.003 to approximately 0.003 to one of approximately 0.125 to approximately 0.132 from the fourth radius R4 to the fifth radius R5.

The sixth profile P6 is located further outward than the fifth profile P5. The sixth profile P6 may surround the fifth profile P5. The sixth profile P6 may extend along the periphery of the fifth profile P5. The sixth profile P6 may directly contact the edge of the fifth profile P5. That is, the sixth profile P6 and the fifth profile P5 may be directly connected to each other.

When viewed from the top, the sixth profile P6 may have a ring shape. When viewed from the top, the sixth profile P6 may have a donut shape.

The sixth profile P6 may be from the fifth radius R5 to the sixth radius R6. The sixth profile P6 may be an area from the fifth radius R5 to the sixth radius R6. The sixth profile P6 may be larger than the fifth radius R5.

The sixth radius R6 may be approximately 138 mm to approximately 139.5 mm. The sixth radius R6 may be approximately 138.5 mm to approximately 139.5 mm.

The width of the sixth profile P6 may be approximately 30 mm to approximately 33.5 mm.

The sixth profile P6 may have the sixth thickness change rate. The sixth thickness change rate may be the average value of thickness change rates at the sixth profile P6.

The sixth thickness change rate may be approximately 0.13 to approximately 0.142. The sixth thickness change rate may be approximately 0.13 to approximately 0.14. The sixth thickness change rate may be approximately 0.132 to approximately 0.14. The sixth thickness change rate may be approximately 0.133 to approximately 0.139.

At the sixth profile P6, the sixth thickness change rate may be nearly constant. That is, at the sixth profile P6, the sixth thickness change rate may have substantially similar values at the innermost and outermost sides.

At the fifth radius R5, the sixth thickness change rate may be approximately 0.13 to 0.135. At the sixth radius R6, the sixth thickness change rate may be approximately 0.132 to approximately 0.138.

The seventh profile P7 is located outside the sixth profile P6. The seventh profile P7 may surround the first profile P1, the second profile P2, the third profile P3, the fourth profile P4, and the fifth profile P5. That is, the seventh profile P7 may extend along the periphery of the first profile P1. The seventh profile P7 may extend along the periphery of the second profile P2. The seventh profile P7 may extend along the periphery of the third profile P3. The seventh profile P7 may extend along the periphery of the fourth profile P4. The seventh profile P7 may extend along the periphery of the fifth profile P5. The seventh profile P7 may extend along the periphery of the sixth profile P6. The seventh profile P7 may directly contact the edge of the sixth profile P6. That is, the seventh profile P7 and the sixth profile P6 may be directly connected to each other.

The seventh profile P7 may be from the sixth radius R6 to the seventh radius R7. That is, the seventh profile P7 may be an area from the sixth radius R6 to the seventh radius R7. The seventh radius R7 may be larger than the sixth radius R6.

The seventh radius R7 may be approximately 141 mm to approximately 142.5 mm. The seventh radius R7 may be approximately 141 mm to approximately 142 mm.

The seventh profile P7 may have the seventh thickness change rate.

The seventh thickness change rate may be approximately 0 to approximately 0.13. The seventh thickness change rate may be approximately 0.03 to approximately 0.1. The seventh thickness change rate may be approximately 0.04 to approximately 0.08.

At the seventh profile P7, as the radius increases, the seventh thickness change rate may gradually decrease. The seventh thickness change rate may gradually decrease from the sixth radius R6 to the seventh radius R7.

At the sixth radius R6, the seventh thickness change rate may be approximately 0.132 to approximately 0.138. At the seventh radius R7, the seventh thickness change rate may be approximately −0.003 to approximately 0.003.

The seventh thickness change rate may decrease from one of approximately 0.132 to approximately 0.138 to one of approximately −0.003 to approximately 0.003 from the sixth radius R6 to the seventh radius R7.

The eighth profile P8 is located outside the seventh profile P7. The eighth profile P8 may surround the first profile P1, the second profile P2, the third profile P3, the fourth profile P4, the fifth profile P5, the sixth profile P6, and the seventh profile P7. That is, the eighth profile P8 may extend along the periphery of the first profile P1. The eighth profile P8 may extend along the periphery of the second profile P2. The eighth profile P8 may extend along the periphery of the third profile P3. The eighth profile P8 may extend along the periphery of the fourth profile P4. The eighth profile P8 may extend along the periphery of the fifth profile P5. The eighth profile P8 may extend along the periphery of the sixth profile P6. The eighth profile P may extend along the periphery of the seventh profile P7. The eighth profile P8 may directly contact the edge of the seventh profile P7. That is, the eighth profile P8 and the seventh profile P7 may be directly connected to each other.

The eighth profile P8 may be from the seventh radius R7 to an eighth radius R8. That is, the eighth profile P8 may be an area from the seventh radius R7 to the eighth radius R8. The eighth radius R8 may be larger than the seventh radius R7. The eighth radius R8 may correspond to the outermost edge of the upper electrode 220.

The eighth radius R8 may be approximately 144.5 mm to approximately 150 mm. The eighth radius R8 may be approximately 145 mm to approximately 148 mm.

The eighth profile P8 may have an eighth thickness change rate.

The eighth thickness change rate may be approximately −0.005 to approximately 0.005. The eighth thickness change rate may be approximately −0.003 to approximately 0.003. The eighth thickness change rate may be approximately −0.002 to approximately 0.002.

At the eighth profile P8, the eighth thickness change rate may be constant overall. The eighth thickness change rate may be constant overall from the seventh radius R7 to the eighth radius R8. At the eighth profile P8, the deviation of the eighth thickness change rate may be less than 0.005. At the eighth profile P8, the deviation of the eighth thickness change rate may be less than 0.003. At the eighth profile P8, the deviation of the eighth thickness change rate may be less than 0.002.

At the seventh radius R7, the eighth thickness change rate may be approximately −0.003 to approximately 0.003. At the eighth radius R8, the eighth thickness change rate may be approximately −0.003 to approximately 0.003.

At the center of the first lower surface 222, the thickness may be approximately 15 mm to approximately 25 mm. At the center of the first lower surface 222, the thickness may be approximately 16 mm to approximately 22 mm.

At the fourth profile P4, the thickness may be approximately 6 mm to approximately 14 mm. At the fourth profile P4, the thickness may be approximately 7 mm to approximately 13 mm.

At the eighth profile P8, the thickness may be approximately 6 mm to approximately 14 mm. At the eighth profile P8, the thickness may be approximately 10 mm to approximately 20 mm.

In addition, the full radius of the upper electrode 220 may be substantially equal to that of the eighth radius R8. The full radius of the upper electrode 220 may be approximately 144.5 mm to approximately 150 mm.

The deviation may be an absolute value of the difference between a thickness change rate and an average value at each location.

In addition, a value obtained by dividing the first radius R1 by the full radius of the upper electrode 220 may be 0.015 to 0.035. A value obtained by dividing the second radius R2 by the full radius of the upper electrode 220 may be 0.10 to 0.13. A value obtained by dividing the third radius R3 by the full radius of the upper electrode 220 may be 0.45 to 0.51. A value obtained by dividing the fourth radius R4 by the full radius of the upper electrode 220 may be 0.49 to 0.53. A value obtained by dividing the fifth radius R5 by the full radius of the upper electrode 220 may be 0.70 to 0.76. A value obtained by dividing the sixth radius R6 by the full radius of the upper electrode 220 may be 0.94 to 0.96. A value obtained by dividing the seventh radius R7 by the full radius of the upper electrode 220 may be 0.97 to 0.98.

In addition, the upper electrode 220 may further include a fastening groove (not shown) formed for fastening with other components. The thickness of the upper electrode 220 may be measured while ignoring the fastening groove. That is, when measuring the thickness of the upper electrode 220, the fastening groove is filled.

As described above, the thickness of the upper electrode 220 according to an embodiment may vary depending on the radius. Accordingly, the first profile P1, the second profile P2, the third profile P3, the fourth profile P4, the fifth profile P5, the sixth profile P6, the seventh profile P7, and the eighth profile P8 may have a thickness change rate within the above-described range.

Accordingly, in the upper electrode 220 according to an embodiment, from the center to the edge, the thickness may gradually decrease and then may gradually increase. That is, the lower surface of the upper electrode 220 according to an embodiment may have a profile that gradually becomes thinner and then thicker again while having a convex shape at the center. In addition, the fourth profile P4 and the fifth profile P5 may have an appropriate width and an overall flat shape.

Accordingly, the upper electrode 220 according to an embodiment may guide plasma to the edge while collecting the plasma in the central portion.

Accordingly, the upper electrode 220 according to an embodiment may generate an overall uniform plasma.

The upper electrode 220 according to an embodiment may properly guide plasma from the center to the edge. That is, the upper electrode 220 according to an embodiment may form overall uniform plasma and impart high straightness to the plasma.

Accordingly, the upper electrode 220 may proceed with an etching process with a uniform thickness. That is, a semiconductor device fabrication apparatus equipped with the upper electrode 220 may uniformly control the etching thickness of a semiconductor substrate.

In addition, the upper electrode 220 according to an embodiment may suppress generation of residual process by-products. That is, the upper electrode 220 according to an embodiment may prevent adsorption of residual process by-products.

Accordingly, in a process for fabricating a semiconductor device, the upper electrode 220 according to an embodiment may prevent defects such as scratches and chatter marks.

The focus ring 230 according to an embodiment may be used in an apparatus for fabricating a semiconductor device. That is, the focus ring 230 may be a component that forms a portion of the semiconductor device fabrication apparatus.

The focus ring 230 may be a component used in a plasma processing apparatus for fabricating a semiconductor device. The focus ring 230 may be a component used in a plasma etching apparatus for selectively etching a semiconductor substrate 30. The semiconductor substrate 30 may be plasma-treated and may include a semiconductor wafer for fabricating a semiconductor device.

The focus ring 230 may be a component that guides plasma and forms a portion of the lower electrode assembly to support the semiconductor substrate 30. The focus ring 230 may be an edge ring disposed at the edge of the lower electrode assembly.

In addition, the focus ring 230 may be a component that forms a portion of an assembly that accommodates the semiconductor substrate 30 and defines the plasma area 114.

Figure 7:
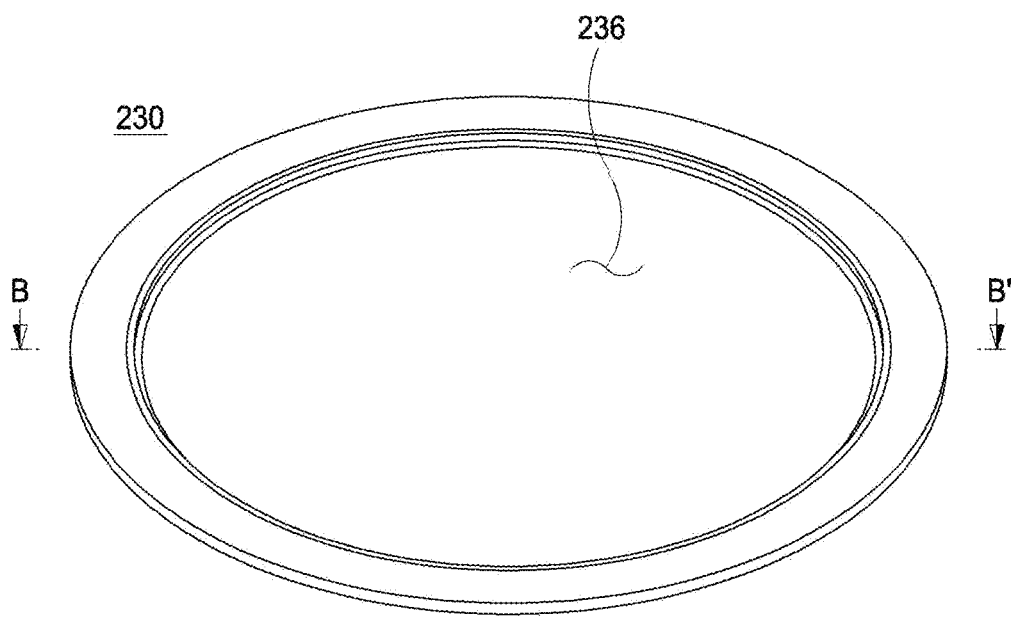
FIG. 7 is a perspective view of a focus ring according to one embodiment of the present disclosure.
Figure 8:
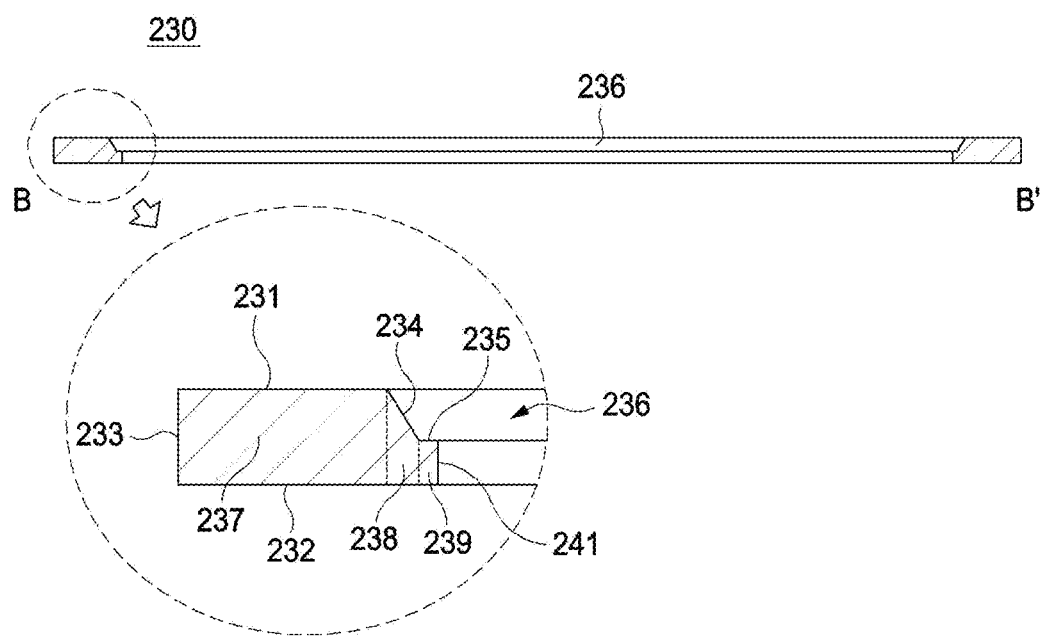
FIG. 8 is a cross-sectional view of the focus ring according to one embodiment of the present disclosure.

FIG. 7 is a perspective view of the focus ring 230 according to an embodiment of the present disclosure. FIG. 8 is a cross-sectional view of the focus ring 230 according to an embodiment of the present disclosure.

Referring to FIGS. 7 and 8, the focus ring 230 according to an embodiment may have an overall ring shape.

The focus ring 230 includes a body portion 237, an inclined portion 238, and a guide portion 239. The body portion 237 may extend along the periphery of the semiconductor substrate 30. The body portion 237 may be disposed along the periphery of the semiconductor substrate 30. The body portion 237 may have a ring shape.

The inclined portion 238 may be formed to extend from the body portion 237. The inclined portion 238 may be formed to extend inward from the body portion 237. The inclined portion 238 may be formed to extend from the body portion 237 toward the center of the semiconductor substrate 30. The inclined portion 238 may have a ring shape. That is, the inclined portion 238 may be placed on the inner circumferential surface of the body portion 237.

The guide portion 239 may be formed to extend from the inclined portion 238. The guide portion 239 may be formed to extend inward from the inclined portion 238. The guide portion 239 may be formed to extend from the inclined portion 238 toward the center of the semiconductor substrate 30. The guide portion 239 may have a ring shape. At least a portion of the guide portion 239 may be disposed below the semiconductor substrate 30.

The body portion 237, the inclined portion 238, and the guide portion 239 may be formed as one body. That is, the body portion 237, the inclined portion 238, and the guide portion 239 may have an integrated structure rather than a coupled structure. The body portion 237, the inclined portion 238, and the guide portion 239 may be integrally formed of single-crystal silicon.

The focus ring 230 may include a second upper surface 231, a second lower surface 232, and a second side 233.

The second upper surface 231 and the second lower surface 232 may be formed to face each other.

The second upper surface 231 may be included in the body portion 237.

The second lower surface 232 may be flat overall.

The second side 233 extends from the second upper surface 231 to the second lower surface 232. The second side 233 may be the outer circumferential surface of the focus ring 230.

In addition, the focus ring 230 may include the second inclined surface 234 extending laterally downward from the second upper surface 231. The second inclined surface 234 may laterally guide plasma process products generated from the semiconductor substrate 30. That is, the second inclined surface 234 may guide process by-products generated by plasma sprayed onto the semiconductor substrate 30 to the outside, thereby improving the efficiency of the semiconductor device fabrication process. In addition, since the second inclined surface 234 may properly guide by-products, the focus ring 230 may prevent other components from being contaminated by the plasma.

In addition, the focus ring 230 may further include a guide surface 235. The guide surface 235 is formed to extend from the second inclined surface 234. The guide surface 235 may be formed to extend inward from the second inclined surface 234. The guide surface 235 may be formed to extend below the semiconductor substrate 30. The guide surface 235 may be formed to extend from the second inclined surface 234 to the center of the semiconductor substrate 30. At least a portion of the guide surface 235 may be disposed below the semiconductor substrate 30.

In addition, the focus ring 230 may further include a third side 241. The third side 241 may be formed to extend from the guide surface 235 to the second lower surface 232. The third side 241 may be the inner circumferential surface of the focus ring 230.

In addition, the focus ring 230 may further include a fastening groove (not shown) formed for fastening with other components.

The focus ring 230 may include single-crystal silicon. The focus ring 230 may include the single-crystal silicon as a main component. The focus ring 230 may include the single-crystal silicon in an amount of approximately 90 wt % or more. The focus ring 230 may include the single-crystal silicon in an amount of approximately 95 wt % or more. The focus ring 230 may include the single-crystal silicon in an amount of approximately 99 wt % or more. The focus ring 230 may be substantially made of single-crystal silicon.

The upper electrode 220 and focus ring 230 according to an embodiment may be manufactured by the following process.

First, raw materials for the upper electrode 220 and the focus ring 230 are prepared.

The raw materials may include silicon. The silicon may have high purity. The silicon may have a purity of approximately 99.999999% or higher.

The raw materials may include a dopant. The dopant may include an n-type dopant such as nitrogen or phosphorus or a p-type dopant such as boron or aluminum.

The single-crystal silicon ingot may be formed by the Czochralski (CZ) method. The Czochralski (CZ) method is a method of growing a crystal by immersing a single-crystal seed in silicon melt and then slowly pulling the seed up.

The single-crystal silicon ingot may be sliced to a thickness of approximately 3 mm to approximately 25 mm. The slicing process may be performed using a wire saw. The wire saw may include a wire and diamond particles bonded around the wire.

Accordingly, by the slicing process, a single-crystal silicon plate is manufactured.

Then, the single-crystal silicon plate may be subjected to a chamfering process. That is, the edges of the single-crystal silicon plate are ground. Accordingly, a first chamfered surface extending from the upper surface of the single-crystal plate and sloping with respect to the first upper surface 221 and a second chamfered surface extending from the lower surface of the single-crystal plate and sloping with respect to the first lower surface 222 are formed.

The chamfering process may be performed using a hand grinder.

The single-crystal silicon plate may be subjected to a grinding process.

The single-crystal silicon plate may be placed between an upper surface plate and a lower surface plate. The single-crystal silicon plate may move relative to the upper and lower surface plates, so that the single-crystal silicon plate is ground.

The outer circumferential surface of the single-crystal silicon plate may be machined. Machining of the outer circumferential surface may be performed using a second grinder.

A single-crystal silicon plate with the outer circumferential surface machined may be subjected to shape machining. Shape machining of the single-crystal silicon plate may be performed using a third grinder.

Using the third grinder, the approximate outline of the focus ring 230 and/or upper electrode 220 may be formed. Cutting may be performed using the third grinder to form an open area in a central part. In addition, using the third grinder, the approximate outlines of the first profile P1, the second profile P2, the third profile P3, the fourth profile P4, and the fifth profile P5 may be formed.

The number of rotations of the third grinder head may be approximately 1500 rpm to approximately 8000 rpm. The number of rotations of the third grinder head may be approximately 1700 rpm to approximately 7500 rpm. The number of rotations of the third grinder head may be approximately 1000 rpm to approximately 6500 rpm.

The third grinder head may have approximately 100 mesh to approximately 2000 mesh. The third grinder head may have approximately 500 mesh to approximately 2000 mesh. The third grinder head may have approximately 1000 mesh to approximately 2000 mesh.

In the shape machining process, the feed may be approximately 1 mm/min to approximately 15 mm/min. In the shape machining process, the feed may be approximately 2 mm/min to approximately 10 mm/min. In the shape machining process, the feed may be approximately 3 mm/min to approximately 8 mm/min.

The first lower surface 222 may be formed through the shape machining. In addition, through the shape machining, a fastening groove may be formed for fastening with other components. In particular, as shown in FIG. 2, through the shape machining, the approximate outlines of the first profile P1, the second profile P2, the third profile P3, and the fourth profile P4 may be formed on the first lower surface 222.

In addition, as shown in FIGS. 3 and 4, through the shape machining, the approximate outlines of the first profile P1, the second profile P2, the third profile P3, the fourth profile P4, the fifth profile P5, the sixth profile P6, and the seventh profile P7 may be formed on the first lower surface 222.

In addition, as shown in FIGS. 5 and 6, through the shape machining, the approximate outlines of the first profile P1, the second profile P2, the third profile P3, the fourth profile P4, the fifth profile P5, the sixth profile P6, the seventh profile P7, and the eighth profile P8 may be formed on the first lower surface 222.

The through-holes 226 may be formed in the single-crystal silicon plate.

The through-holes 226 may be formed using a drill.

The through-holes 226 may be formed by electric discharge machining.

By the shape machining process and/or the process of forming the through-holes 226, an unprocessed focus ring and/or an unprocessed upper electrode 220 may be formed.

The unprocessed focus ring and/or the unprocessed upper electrode 220 may be subjected to a wrapping process.

The unprocessed focus ring and/or the unprocessed upper electrode 220 may be placed between an upper surface plate and a lower surface plate, and the unprocessed focus ring and/or the unprocessed upper electrode 220 may move relative to the upper surface plate and the lower surface plate, so that the unprocessed focus ring and/or the unprocessed upper electrode 220 may be wrapped.

The unprocessed focus ring and/or the unprocessed upper electrode 220 may be rotated relative to the upper surface plate and/or the lower surface plate at a speed of approximately 5 rpm to approximately 25 rpm.

In the wrapping process, the upper surface plate and the lower surface plate may have approximately 800 mesh to approximately 1800 mesh.

In the wrapping process, the pressure of the upper surface plate and lower surface plate may be approximately 60 psi to approximately 200 psi.

The unprocessed focus ring and the unprocessed upper electrode 220 may be surface-processed by a wet etching process.

The surfaces of the unprocessed focus ring and the unprocessed the upper electrode 220 may be etched using an etchant for the wet etching process. The etchant may include deionized water and an acid. The etchant may include an acid such as sulfuric acid or hydrofluoric acid. The etchant may include one or more salts consisting of ammonium hydrogen fluoride, ammonium sulfate, and ammonium sulfamate.

Based on a total weight, the etchant may include deionized water in an amount of approximately 20 wt % to approximately 50 wt %.

Based on 100 parts by weight of the deionized water, the etchant may include the acid in an amount of approximately 70 parts by weight to approximately 200 parts by weight. Based on 100 parts by weight of the deionized water, the etchant may include the acid in an amount of approximately 90 parts by weight to approximately 150 parts by weight.

Based on 100 parts by weight of the deionized water, the etchant may include the ammonium hydrogen fluoride in an amount of approximately 15 parts by weight to approximately 45 parts by weight. Based on 100 parts by weight of the deionized water, the etchant may include the ammonium hydrogen fluoride in an amount of approximately 17 parts by weight to approximately 30 parts by weight.

Based on 100 parts by weight of the deionized water, the etchant may include the ammonium sulfate in an amount of approximately 15 parts by weight to approximately 45 parts by weight. Based on 100 parts by weight of the deionized water, the etchant may include the ammonium sulfate in an amount of approximately 17 parts by weight to approximately 30 parts by weight.

Based on 100 parts by weight of the deionized water, the etchant may include the ammonium sulfamate in an amount of approximately 5 parts by weight to approximately 20 parts by weight. Based on 100 parts by weight of the deionized water, the etchant may include the ammonium sulfamate in an amount of approximately 5 parts by weight to approximately 15 parts by weight.

The unprocessed focus ring and/or the unprocessed upper electrode 220 may be immersed in the etchant to perform the etching process. The immersion time may be approximately 10 minutes to approximately 100 minutes. The immersion time may be approximately 5 minutes to approximately 20 minutes. The immersion time may be approximately 10 minutes to approximately 30 minutes.

Since the etching process is performed using the etchant having the composition for the immersion time within the range, the surfaces of the unprocessed focus ring and the unprocessed the upper electrode 220 may be appropriately etched. Accordingly, the focus ring 230 according to an embodiment and the upper electrode 220 according to an embodiment may have appropriate surface properties.

The unprocessed focus ring and/or the unprocessed upper electrode 220 may be surface-treated by a polishing process.

A polishing pad may be used in the polishing process. The Shore C hardness of the polishing pad may be approximately 50 to approximately 90. The polishing pad may be a suede-type or non-woven fabric-type pad.

In the polishing process, a polishing slurry may be used. The polishing slurry may contain deionized water and colloidal silica.

Based on a total weight, the polishing slurry may include the colloidal silica in an amount of approximately 20 wt % to approximately 50 wt %. Based on a total weight, the polishing slurry may include the colloidal silica in an amount of approximately 30 wt % to approximately 45 wt %.

The average particle diameter of the colloidal silica may be approximately 20 nm to approximately 100 nm. The average particle diameter of the colloidal silica may be approximately 50 nm to approximately 100 nm. The average particle diameter of the colloidal silica may be approximately 60 nm to approximately 85 nm.

The pH of the polishing slurry may be approximately 8.5 to approximately 11. The pH of the polishing slurry may be approximately 9.0 to approximately 10.5.

In the polishing process, polishing pressure may be approximately 200 psi to approximately 350 psi.

In addition, in the polishing process, the rotation speed of the surface plate may be approximately 6 rpm to approximately 15 rpm.

In addition, the polishing process time may be approximately 60 minutes to approximately 75 minutes.

The focus ring and upper electrode 220 that have been subjected to the polishing process are cleaned using a cleaning solution.

The cleaning solution may include deionized water, hydrogen peroxide, and ammonia.

Based on a total weight, the cleaning solution may include deionized water in an amount of approximately 90 wt % to approximately 97 wt %.

Based on 100 parts by weight of the deionized water, the cleaning solution may include the hydrogen peroxide in an amount of approximately 1 part by weight to approximately 10 parts by weight. Based on 100 parts by weight of the deionized water, the cleaning solution may include the hydrogen peroxide in amount of approximately 1 part by weight to approximately 7 parts by weight.

Based on 100 parts by weight of the deionized water, the cleaning solution may include ammonia in an amount of approximately 1 part by weight to approximately 8 parts by weight. Based on 100 parts by weight of the deionized water, the cleaning solution may include ammonia in an amount of approximately 1 part by weight to approximately 5 parts by weight.

The focus ring 230 and the upper electrode 220 may be immersed in the cleaning solution for approximately 20 minutes to approximately 30 minutes.

In addition, the cleaning solution may be sprayed onto the focus ring 230 and/or the upper electrode 220 to perform the cleaning process.

In addition, the cleaning solution may be sprayed inside the through-holes 226, and the inside of the through-holes 226 may be cleaned.

Then, the focus ring 230 and/or the upper electrode 220 may be cleaned using deionized water.

As described above, through the appropriate shape machining process, the appropriate etching process, the appropriate polishing process, and the appropriate wrapping process, the upper electrode 220 may be manufactured. Accordingly, the upper electrode 220 may include a lower surface having desired first to fifth profiles.

In particular, through the manufacturing process described above, the deviation of the third thickness change rate and the deviation of the fifth thickness change rate may be reduced.

Accordingly, the component for a semiconductor device fabrication apparatus according to an embodiment may improve plasma uniformity. Accordingly, the component for a semiconductor device fabrication apparatus according to an embodiment may minimize defects which occur in the process of fabricating the semiconductor substrate 30.

Figure 9:
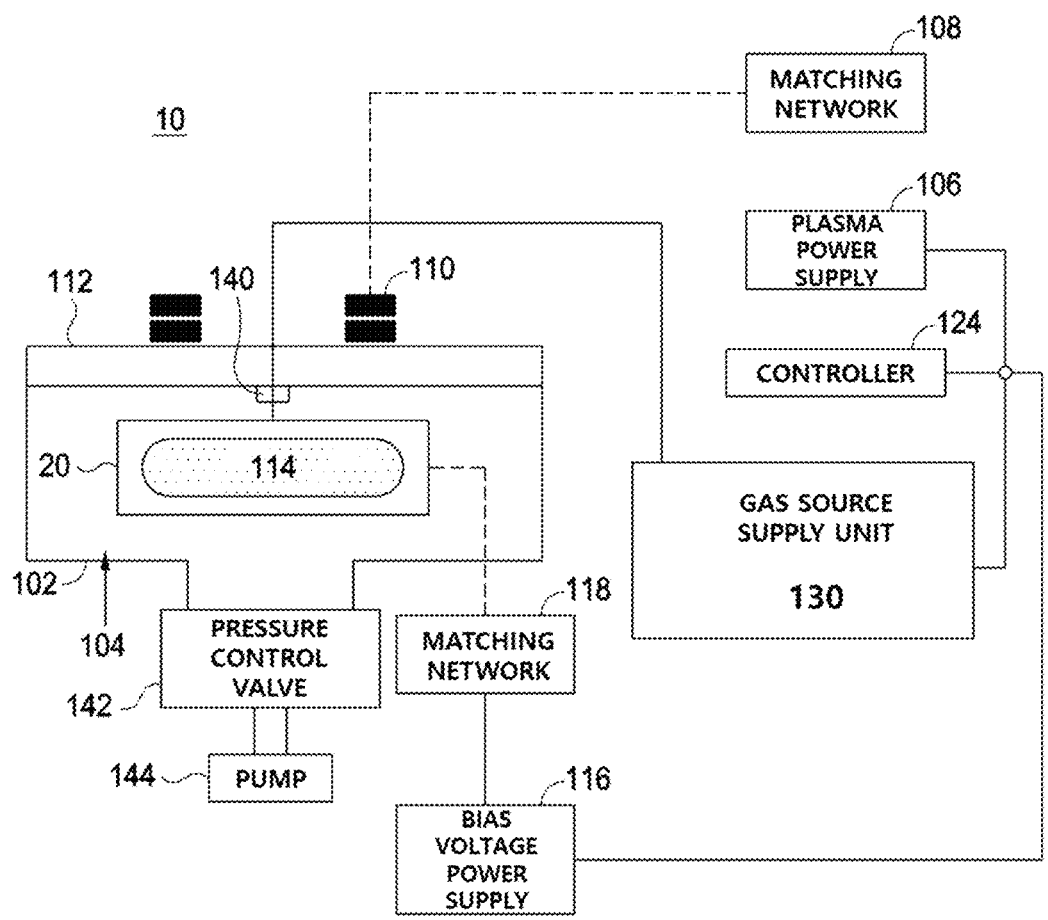
FIG. 9 illustrates a semiconductor device fabrication apparatus according to one embodiment of the present disclosure.
Figure 10:
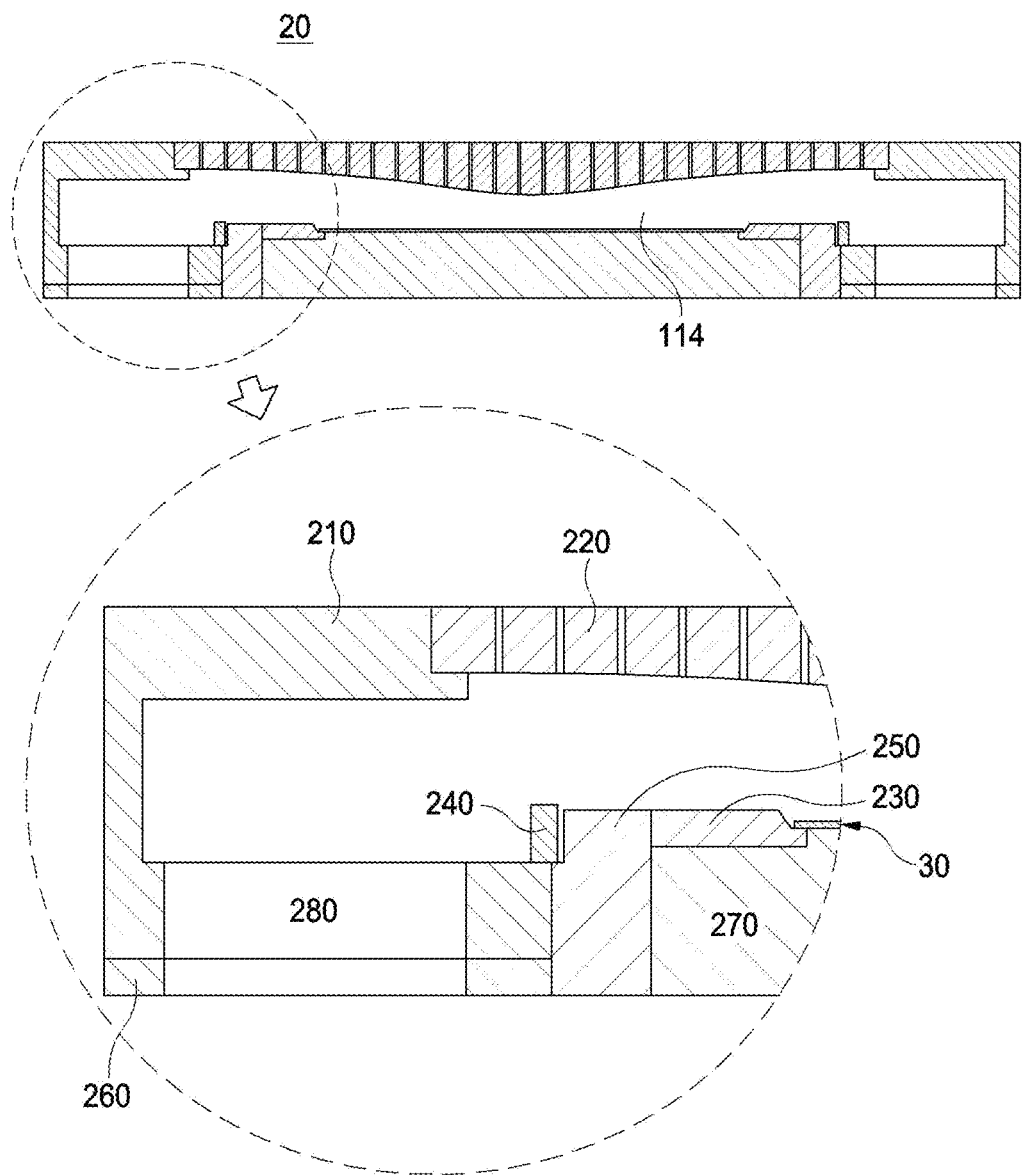
FIG. 10 is a cross-sectional view of a plasma region-confined assembly according to one embodiment of the present disclosure.

FIG. 9 illustrates the semiconductor device fabrication apparatus 10 according to an embodiment of the present disclosure. FIG. 10 is a cross-sectional view of the plasma area-confined assembly 20 according to an embodiment of the present disclosure.

Referring to FIGS. 9 and 10, the semiconductor device fabrication apparatus according to an embodiment includes a plasma reactor 102 having a plasma processing chamber 104 therein. In addition, the semiconductor device fabrication apparatus according to an embodiment may further include the plasma area-confined assembly 20 disposed inside the plasma processing chamber 104. The plasma processing chamber 104 may be substantially identical to the plasma area-confined assembly 20.

In addition, the semiconductor device fabrication apparatus according to an embodiment includes a matching network 108. The semiconductor device fabrication apparatus according to an embodiment includes a plasma power supply 106 tuned by the matching network 108. The plasma power supply 106 provides inductively coupled power to the plasma reactor 102. Accordingly, plasma may be generated in the plasma area-confined assembly 20. More specifically, the plasma power supply 106 supplies power to a transformer coupled plasma (TCP) coil 110 located near a power window 112 to generate the plasma. The TCP coil 110 may be configured to generate a uniform diffusion profile of the plasma within the plasma area-confined assembly 20. For example, the TCP coil 110 may be configured to produce a toroidal power distribution within the plasma-confined assembly.

In the power window 112, the TCP coil may be spaced apart from the plasma processing chamber 104 at a certain interval. In addition, the TCP coil 110 may supply energy to the plasma processing chamber 104 while being spaced apart from the plasma processing chamber 104.

The semiconductor device fabrication apparatus according to an embodiment may further include a bias voltage power supply 116 tuned by the matching network 118.

The bias voltage power supply 116 may set a bias voltage on the semiconductor substrate 30 through an electrostatic chuck 270. That is, the bias voltage power supply 116 may supply power for setting the bias voltage to the semiconductor substrate 30.

The semiconductor device fabrication apparatus according to an embodiment may further include a controller 124. The controller 124 may control operation of the plasma power supply 106, a gas source supply unit 130, and the bias voltage power supply 116.

For example, the plasma power supply 106 and the bias voltage power supply 116 may be configured to operate at specific radio frequencies, such as approximately 13.56 MHz, 27 MHz, 2 MHz, 60 MHz, 400 KHz, 2.54 GHz, or combinations thereof.

The plasma power supply 106 and the bias voltage power supply 116 may adjust the amount of supplied power to achieve target process performance. For example, the plasma power supply 106 may supply power in the range of approximately 50 W to approximately 5000 W. The bias voltage power supply 116 may supply a bias voltage in the range of approximately 20 V to approximately 2000 V.

In addition, the semiconductor device fabrication apparatus according to an embodiment may further include the gas source supply unit 130. The gas source supply unit 130 may be fluidly connected to the plasma region-confined assembly 20 through a gas inlet such as a gas injector 140.

In addition, the semiconductor device fabrication apparatus according to an embodiment may include a pressure control valve 142 and pump 144, which serve to maintain a specific pressure within the plasma processing chamber 104. By-products are removed from the plasma process-confined chamber 104 by the pressure control valve 142 and the pump 144. The pressure control valve 142 may maintain process pressure below 1 Torr during processing.

As shown in FIG. 10, the plasma area-confined assembly 20 may include a cover 210, the upper electrode 220, the focus ring 230, a first insulating ring 250, a second insulating ring 240, a third insulating ring 260, and the electrostatic chuck 270.

The cover 210 may be placed on an outer portion of the plasma area 114. The cover 210 may be formed to extend along the outer portion of the plasma area 114. The cover 210 may be disposed along the periphery of the plasma area 114.

The cover 210 may support the upper electrode 220. The cover 210 may be fastened to the upper electrode 220. In addition, the cover 210 may be fastened to the second insulating ring 240. In addition, the cover 210 may be fastened to the third insulating ring 260. The cover 210 may support the third insulating ring 260.

The cover 210 may include silicon. The cover 210 may be made of silicon. The cover 210 may include polysilicon or single-crystal silicon. The cover 210 may be made of polysilicon.

The cover 210 may include a discharge portion 280 through which process by-products generated in the plasma area 114 are discharged. The discharge portion 280 may be connected to the plasma area 114.

The upper electrode 220 and the focus ring 230 may have the same properties as described above.

The upper electrode 220 may be seated on the cover 210. The upper electrode 220 may be fastened to the cover 210. The upper electrode 220 may be coupled to the cover 210.

The upper electrode 220 may be placed over the plasma area 114. The upper electrode 220 may be placed on the plasma area 114. The upper electrode 220 may cover the upper portion of the plasma area 114 entirely. The upper electrode 220 may be formed to face the semiconductor substrate 30 with the plasma area 114 disposed therebetween.

The focus ring 230 may be formed to extend along the periphery of the semiconductor substrate 30. The focus ring 230 may be placed on the electrostatic chuck 270. The focus ring 230 may extend along the perimeter of the plasma area 114. The focus ring 230 may be placed inside the first insulating ring 250.

The focus ring 230 may surround a portion where the semiconductor substrate 30 is placed. The focus ring 230 may form a space 236 where the semiconductor substrate 30 is placed. The focus ring 230 may be placed at an edge portion of the semiconductor substrate 30.

The first insulating ring 250 may surround the focus ring 230. The first insulating ring 250 may surround the electrostatic chuck 270. The first insulating ring 250 may extend along an outer circumferential surface of the electrostatic chuck 270. The first insulating ring 250 may extend along an outer circumferential surface of the focus ring 230. The first insulating ring 250 may cover the outer circumferential surface of the focus ring 230 and the outer circumferential surface of the electrostatic chuck 270.

The first insulating ring 250 is disposed between the cover 210 and the focus ring 230. In addition, the first insulating ring 250 may be disposed between the cover 210 and the electrostatic chuck 270.

In addition, the first insulating ring 250 may have a high electrical resistance. That is, the first insulating ring 250 may have a high insulating property. Accordingly, the first insulating ring 250 may electrically insulate the focus ring 230 and the cover 210 from each other. In addition, the first insulating ring 250 may electrically insulate the electrostatic chuck 270 and the cover 210 from each other.

The first insulating ring 250 may contain a material that has high electrical resistance and high etch resistance. The first insulating ring 250 may include quartz. The first insulating ring 250 may include melt quartz and/or synthetic quartz.

The first insulating ring 250 may be made of quartz. The first insulating ring 250 may be made of quartz having a purity of approximately 99.99% or more.

The second insulating ring 240 is disposed outside the first insulating ring 250. The second insulating ring 240 may surround the outer circumferential surface of the first insulating ring 250. The second insulating ring 240 may be formed to extend along the periphery of the first insulating ring 250.

The second insulating ring 240 may reinforce the insulating properties of the first insulating ring 250. The second insulating ring 240 may insulate between the focus ring 230 and the cover 210. In addition, the second insulating ring 240 may insulate between the electrostatic chuck 270 and the cover 210.

The second insulating ring 240 may include a material that has high electrical resistance and high etch resistance.

The second insulating ring 240 may include quartz. The second insulating ring 240 may include melt quartz and/or synthetic quartz.

The second insulating ring 240 may be made of quartz. The second insulating ring 240 may be made of quartz having a purity of approximately 99.99% or more.

The third insulating ring 260 may be placed under the cover 210. The third insulating ring 260 may be placed outside the first insulating ring 250. The third insulating ring 260 may extend along the outer circumferential surface of the first insulating ring 250. The third insulating ring 260 may be placed outside the electrostatic chuck 270.

The third insulating ring 260 may be disposed around the discharge portion 280. The discharge portion 280 may be an exhaust port for discharging process by-products generated in the plasma area 114.

The third insulating ring 260 may include a material that has high electrical resistance and high etch resistance. The third insulating ring 260 may include quartz. The third insulating ring 260 may include melt quartz and/or synthetic quartz.

The third insulating ring 260 may be made of quartz. The third insulating ring 260 may be made of quartz having a purity of approximately 99.99% or more.

The semiconductor device fabrication apparatus according to an embodiment may treat the semiconductor substrate 30 with plasma. The semiconductor device fabrication apparatus according to an embodiment may fabricate a semiconductor device by treating the semiconductor substrate 30 with plasma.

The semiconductor substrate 30 may include a wafer, an etch target layer disposed on the wafer, and a mask pattern disposed on the etch target layer.

The etch target layer may be a conductive layer including a metal layer. The etch target layer may be a dielectric layer containing an oxide film.

The mask pattern may selectively expose the etch target layer. The mask pattern may include a photoresist layer. The photoresist layer may be patterned by light.

To treat the semiconductor substrate 30 with plasma, the semiconductor substrate 30 is placed on the electrostatic chuck 270. In addition, the semiconductor substrate 30 may be disposed within the focus ring 230. The semiconductor substrate 30 may be placed on the guide portion 239.

Then, plasma may be sprayed onto the semiconductor substrate 30. The plasma is sprayed onto the semiconductor substrate 30 through the upper electrode 220. The plasma may be formed by a gas source.

The gas source may include hydrogen gas ($H_2$), nitrogen gas ($N_2$), and fluorine-based gas. The fluorine-based gas may include hydrogen fluoride or fluorocarbon ($CH_xF_{4-x}$, x is an integer from 1 to 3).

The flow ratio of the hydrogen gas and the nitrogen gas may be approximately 3:1 to approximately 7:1. In addition, the flow ratio of the hydrogen and the fluorine-based gas may be approximately 10:1 to approximately 100:1.

By means of the plasma, the etch target layer may be selectively etched. Accordingly, a conductive pattern or insulating pattern may be formed on the wafer.

Since the focus ring 230 and the upper electrode 220 have the above-described characteristics, the semiconductor device fabrication apparatus according to an embodiment may prevent defects occurring during the process of fabricating the semiconductor substrate 30.

In particular, since the upper electrode 220 has the above-described properties, the upper electrode 220 may improve the straightness of plasma. Accordingly, the semiconductor device fabrication apparatus according to an embodiment may improve etching uniformity.

Accordingly, the component for a semiconductor device fabrication apparatus according to an embodiment may prevent external and internal contamination and prevent contaminants from transferring into the chamber of a semiconductor device fabrication apparatus. Accordingly, the component for a semiconductor device fabrication apparatus according to an embodiment may minimize defects that occur during a semiconductor substrate fabrication process.

In addition, the surface of the component for a semiconductor device fabrication apparatus according to an embodiment has an appropriate dopant peak. Accordingly, the component for a semiconductor device fabrication apparatus according to an embodiment has appropriate electrical properties, and may minimize defects which occur by the dopant.

In addition, the component for a semiconductor device fabrication apparatus according to an embodiment has a surface having a low body-centered cubic ratio and a low rhombohedral ratio. Accordingly, the frequency of crystal defects on the surface of the component for a semiconductor device fabrication apparatus according to an embodiment may be low.

Accordingly, in a process of fabricating a semiconductor substrate, the component for a semiconductor device fabrication apparatus according to an embodiment may prevent excessive wear caused by the crystal defects. Accordingly, the component for a semiconductor device fabrication apparatus according to an embodiment may suppress generation of particles in a process chamber due to the excessive wear. Accordingly, the component for a semiconductor device fabrication apparatus according to an embodiment may prevent defects which occur in a process of fabricating a semiconductor substrate. In addition, since excessive wear is suppressed, the component for a semiconductor device fabrication apparatus according to an embodiment may have improved durability.

As shown in FIG. 2, the thickness of the upper electrode according to an embodiment may vary depending on the radius thereof. Accordingly, the lower surface of the upper electrode according to an embodiment includes a first profile having a first thickness change rate, a third profile having a third thickness change rate, and a fifth profile having a fifth thickness change rate.

In particular, the first thickness change rate may be approximately −0.1 to approximately 0, the third thickness change rate may be approximately −0.115 to approximately −0.122, and the fifth thickness change rate may be approximately −0.003 to approximately 0.003.

Accordingly, the thickness of the upper electrode according to an embodiment may gradually decrease from the center to the edge. That is, the lower surface of the upper electrode according to an embodiment may have a profile that is appropriately thin while having a convex shape at the center.

Accordingly, the upper electrode according to an embodiment may reinforce plasma in the central portion to improve the straightness of the plasma.

Accordingly, the upper electrode according to an embodiment may generate an overall uniform plasma.

In particular, as the diameter of the upper electrode increases, the plasma density of the upper electrode may decrease toward the central portion. At this time, since the upper electrode includes profiles having the thickness change rates described above, overall uniform plasma may be implemented.

In addition, the upper electrode according to an embodiment may suppress generation of residual process by-products. That is, the upper electrode according to an embodiment may prevent adsorption of residual process by-products.

Accordingly, in a process for fabricating a semiconductor device, the upper electrode according to an embodiment may prevent defects such as scratches and chatter marks.

As shown in FIGS. 3 and 4, the thickness of the upper electrode according to an embodiment may vary depending on the radius thereof. Accordingly, the lower surface of the upper electrode according to an embodiment includes a first profile having a first thickness change rate, a second profile having a second thickness change rate, a third profile having a third thickness change rate, a fourth profile having a fourth thickness change rate, a fifth profile having a fifth thickness change rate, and a seventh profile having a seventh thickness change rate.

When the first thickness change rate is within the range of −0.385 to 0, the thickness gradually decreases from the center of the lower surface to the edge, and the second thickness change rate is −0.37 to −0.39. When the third profile is within the range of −0.385 to 0, the thickness gradually increases from the center of the lower surface to the edge. When the fourth thickness change rate is within the range of 0 to 0.105, the thickness gradually increases from the center of the lower surface to the edge, the fifth thickness change rate is 0.1 to 0.11, and the seventh thickness change rate is −0.003 to 0.003.

Accordingly, from the center to the edge, the thickness of the upper electrode according to an embodiment may gradually decrease and then gradually increase again. That is, the lower surface of the upper electrode according to an embodiment may have a profile that gradually becomes thinner and then thicker again while having a convex shape. In addition, the upper electrode according to an embodiment may have the characteristic of rapidly changing thickness near the center.

Accordingly, the upper electrode according to an embodiment may reinforce plasma in the central portion and edge portion to improve the straightness of the plasma.

Accordingly, the upper electrode according to an embodiment may generate an overall uniform plasma.

In particular, as the diameter of the upper electrode increases, plasma density may be reduced in the central portion and edge portion of the upper electrode. At this time, since the upper electrode includes profiles having the thickness change rates described above, an overall uniform plasma may be implemented.

In addition, since the upper electrode according to an embodiment implements an overall uniform plasma, the generation of residual process by-products may be suppressed. That is, the upper electrode according to an embodiment may prevent adsorption of residual process by-products.

Accordingly, in a process for fabricating a semiconductor device, the upper electrode according to an embodiment may prevent defects such as scratches and chatter marks.

In addition, in the process for fabricating a semiconductor device, since the upper electrode according to an embodiment prevents plasma from concentrating at a specific area, etching of the specific area may be prevented.

Accordingly, the upper electrode according to an embodiment may suppress excessive wear caused by plasma in a plasma generation area. Accordingly, the durability of a semiconductor device fabrication apparatus including the upper electrode according to an embodiment may be improved.

As shown in FIGS. 5 and 6, as described above, the thickness of the upper electrode 220 may vary depending on the radius thereof. Accordingly, the lower surface of the upper electrode 220 includes a first profile having a first thickness change rate, a second profile having a second thickness change rate, a fourth profile having a fourth thickness change rate, a sixth profile having a sixth thickness change rate, and an eighth profile having an eighth thickness change rate.

As described above, the first profile may have a first thickness change rate of −0.25 to 0, the second profile may have a second thickness change rate of −0.25 to −0.24, the fourth profile may have a fourth thickness change rate of −0.003 to 0.003, the sixth profile has a sixth thickness change rate of −0.14 to −0.16, and the eighth profile may have an eighth thickness change rate of −0.003 to 0.003.

Accordingly, in the upper electrode 220, from the center to the edge, the thickness of the upper electrode 220 may gradually decrease and then gradually increase again. That is, the lower surface of the upper electrode 220 may have a profile that gradually becomes thinner and then thicker again while having a convex shape at the center.

Accordingly, the upper electrode 220 may improve the straightness of plasma by reinforcing plasma in the central portion and the edge portion.

Accordingly, the upper electrode 220 may generate an overall uniform plasma.

In particular, as the diameter of the upper electrode 220 increases, the plasma density at the central portion and edge portion of the upper electrode 220 may decrease. Here, since the upper electrode 220 includes the profiles having the thickness change rates, overall uniform plasma may be realized.

In addition, since the upper electrode 220 implements overall uniform plasma, generation of residual process by-products may be suppressed. That is, the upper electrode 220 may prevent adsorption of residual process by-products.

Accordingly, in a process for fabricating a semiconductor device, the upper electrode 220 may prevent defects such as scratches and chatter marks.

In addition, in the process for fabricating a semiconductor device, since the upper electrode 220 prevents plasma from concentrating at a specific area, etching of the specific area may be prevented.

Accordingly, the upper electrode 220 may suppress excessive wear caused by plasma in a plasma generation area. Accordingly, the durability of the semiconductor device fabrication apparatus including the upper electrode 220 may be improved. That is, the durability of the components included in the semiconductor device fabrication apparatus may be improved by the upper electrode 220.

Accordingly, through the semiconductor device fabrication apparatus according to an embodiment, a semiconductor fabrication process having improving etching uniformity may be provided. That is, as the radius of the semiconductor substrate fabricated using the semiconductor device fabrication apparatus according to an embodiment increases, the etching thickness of the semiconductor substrate may be uniform throughout the semiconductor substrate.

In addition, in the semiconductor device fabrication apparatus according to an embodiment, the upper electrode 220 may be omitted. That is, the semiconductor device fabrication apparatus in which the upper electrode 220 is omitted may later be equipped with the upper electrode 220 separately. In the semiconductor device fabrication apparatus according to an embodiment, the upper electrode 220 may be omitted, and the upper electrode 220 may be installed later. That is, the semiconductor device fabrication apparatus according to an embodiment may be configured such that the upper electrode 220 is mounted thereon.

In addition, the features, structures, effects, and the like described in the embodiments above are included in at least one embodiment of the present disclosure and are not necessarily limited to only one embodiment. In addition, the features, structures, effects, and the like described in each embodiment may be combined or modified by those skilled in the art to which the present invention pertains. Therefore, contents related to such combinations and modifications should be construed as being included in the scope of the present disclosure.

The present invention has been described with reference to the embodiments, but the embodiments are merely examples and the present invention is not limited thereto. Those of ordinary skill in the field to which the present invention pertains will recognize that various modifications and applications not exemplified above are possible without departing from the essential characteristics of the present disclosure. For example, each component specifically shown in the embodiment may be modified and implemented. These variations and differences in application should be construed as being included in the scope of the present invention as defined in the appended claims. Furthermore, the embodiments may be combined to form additional embodiments.

Manufacturing Example 1

Using the Czochralski method, a silicon ingot having a diameter of approximately 330 mm was manufactured. The silicon ingot was cut using a diamond wire saw to produce a single-crystal silicon plate having a thickness of approximately 20 mm. Then, the edges of the single-crystal silicon plate were cut to form a chamfer surface.

Then, the single-crystal silicon plate that had been subjected to the chamfering process was placed between an upper surface plate and a lower surface plate and wrapped by the upper surface plate and the lower surface plate. Then, the shape of the wrapped single-crystal silicon plate was machined using a grinder. As a result, an unprocessed upper electrode was formed.

The shape machining process was performed under the following conditions.
1) Grinder head: 800 mesh
2) Grinder rotation rate: 6000 rpm
3) Feed: 0.7 mm/minute Then, the unprocessed upper electrode was immersed in an etchant at room temperature for approximately 7 minutes to treat the outer surface of the unprocessed upper electrode, thereby producing an upper electrode.

The ingredients of the etchant are as follows.
1) Deionized water: 35%/wt parts by weight
2) Sulfuric acid: 60%/wt parts by weight
3) Ammonium nitrate: 5%/wt parts by weight The lower surface of the upper electrode includes a first profile (radius from 0 to 8.5 mm), a second profile (radius from 8.5 mm to 12.3 mm), a third profile (radius from 12.3 mm to 57.4 mm), a fourth profile (radius from 57.4 mm to 88.4 mm), and a fifth profile (radius from 88.4 mm to 100 mm). In addition, the thickness at the center of the upper electrode was approximately 17.1 mm, and the thickness at the outermost edge of the upper electrode was approximately 9.3 mm.

At the center of the first profile, the thickness change rate was 0. At a radius of 8 mm, the thickness change rate was −0.081. In addition, from the center of the first profile to a radius of 8 mm, the thickness change rate continued to decrease.

In addition, at a radius of 12.5 mm, the thickness change rate was approximately −0.115. At the second profile, the thickness change rate continued to decrease.

In addition, at a radius of 58 mm, the thickness change rate was approximately −0.115. At the third profile, the thickness change rate was constant. At the third profile, the thickness change rate deviation was less than 0.003.

In addition, at a radius of 88 mm, the thickness change rate was approximately 0. At the fourth profile, the thickness change rate continued to increase.

In addition, at a radius of 100 mm, the thickness change rate was approximately 0. At the fifth profile, the thickness change rate was constant. At the fifth profile, the thickness change rate deviation was less than 0.003.

Manufacturing Examples 2 to 6

As shown in Table 1 below, the shapes of the first profile, the second profile, the third profile, the fourth profile, and the fifth profile were changed. In Manufacturing Example 6, the upper electrode had a flat shape having a thickness of 14 mm.

Then, the single-crystal silicon plate that had been subjected to the chamfering process was placed between an upper surface plate and a lower surface plate and wrapped by the upper surface plate and the lower surface plate. Then, the shape of the wrapped single-crystal silicon plate was machined using a grinder. As a result, an unprocessed upper electrode was formed.

The shape machining process was performed under the following conditions.

1) Grinder head: 1000 mesh
2) Grinder rotation rate: 6000 rpm
3) Feed: 0.7 mm/minute Then, the unprocessed upper electrode was immersed in an etchant at room temperature for approximately 6500 seconds to treat the outer surface of the unprocessed upper electrode, thereby producing an upper electrode.

The ingredients of the etchant are as follows.

1) Deionized water: 35%/wt parts by weight
2) Sulfuric acid: 60%/wt parts by weight
3) Ammonium nitrate: 5%/wt parts by weight The lower surface of the upper electrode includes a first profile (radius from 0 to 4 mm), a second profile (radius from 4 mm to 9 mm), a third profile (radius from 9 mm to 79 mm), a fourth profile (radius from 79 mm to 111 mm), a fifth profile (radius from 111 mm to 139 mm), a sixth profile (radius from 139 mm to 141 mm), and a seventh profile (radius from 141 mm to 150 mm). In addition, the thickness at the center of the upper electrode was approximately 25 mm. The thickness at the portion where the third profile and

TABLE 1

| Classification | Radius 0 Thickness change rate | Radius 8 mm Thickness change rate | Radius 12.5 mm Thickness change rate | Radius 58 mm Thickness change rate | Radius 88 mm Thickness change rate | Radius 100 mm Thickness change rate |
|---|---|---|---|---|---|---|
| Manufacturing Example 1 | 0 | −0.081 | −0.115 | −0.115 | 0 | 0 |
| Manufacturing Example 2 | 0 | −0.079 | −0.116 | −0.117 | 0 | 0 |
| Manufacturing Example 3 | 0 | −0.078 | −0.120 | −0.119 | 0 | 0 |
| Manufacturing Example 4 | 0 | −0.083 | −0.120 | −0.120 | 0 | 0 |
| Manufacturing Example 5 | 0 | −0.081 | −0.122 | −0.122 | 0 | 0 |
| Manufacturing Example 6 | 0 | 0 | 0 | 0 | 0 | 0 |

TABLE 2

| Classification | Center thickness (mm) |
|---|---|
| Manufacturing Example 1 | 17.1 |
| Manufacturing Example 2 | 16.8 |
| Manufacturing Example 3 | 16.6 |
| Manufacturing Example 4 | 16.2 |
| Manufacturing Example 5 | 16.4 |
| Manufacturing Example 6 | 14 |

Manufacturing Example 7

Using the Czochralski method, a silicon ingot having a diameter of approximately 330 mm was manufactured. The silicon ingot was cut using a diamond wire saw to produce a single-crystal silicon plate having a thickness of approximately 20 mm. Then, the edges of the single-crystal silicon plate were cut to form a chamfer surface.

the fourth profile meet was 10.3 mm. The thickness at the eighth profile was approximately 14 mm.

At the center of the first profile, the thickness change rate was 0. At a radius of 4 mm, the thickness change rate was −0.38. In addition, from the center of the first profile to a radius of 4 mm, the thickness change rate continued to decrease.

In addition, at a radius of 9 mm, the thickness change rate was approximately −0.378. At the second profile, the thickness change rate showed little change within a deviation of approximately 0.01.

In addition, at a radius 79 mm, the thickness change rate was approximately 0. At the third profile, the thickness change rate continued to increase.

In addition, at a radius of 111 mm, the thickness change rate was approximately 0.101. At the fourth profile, the thickness change rate continued to increase.

In addition, at a radius of 139 mm, the thickness change rate was approximately 0.103. At the fifth profile, the thickness change rate showed little change within a deviation of approximately 0.01.

In addition, at a radius of 141 mm, the thickness change rate was approximately 0. At the sixth profile, the thickness change rate decreased rapidly.

In addition, at a radius of 150 mm, the thickness change rate was approximately 0. At the seventh profile, the thickness change rate was constant. At the seventh profile, the thickness change rate was approximately 0. At the seventh profile, the deviation of the thickness change rate was less than 0.003.

Manufacturing Examples 8 to 12

As shown in Tables 3 and 4 below, the shapes of the first profile, the second profile, the third profile, the fourth profile, the fifth profile, the sixth profile, the seventh profile, and the eighth profile were changed. In Manufacturing Example 12, the upper electrode had a flat shape having a thickness of 15 mm.

TABLE 3

| Classification | Radius 0 Thickness change rate | Radius 4 mm Thickness change rate | Radius 9 mm Thickness change rate | Radius 79 mm Thickness change rate | Radius 111 mm Thickness change rate | Radius 139 mm Thickness change rate |
|---|---|---|---|---|---|---|
| Manufacturing Example 7 | 0 | −0.38 | −0.378 | 0 | 0.101 | 0.103 |
| Manufacturing Example 8 | 0 | −0.379 | −0.378 | 0 | 0.102 | 0.103 |
| Manufacturing Example 9 | 0 | −0.381 | −0.379 | 0 | 0.103 | 0.102 |
| Manufacturing Example 10 | 0 | −0.382 | −0.380 | 0 | 0.101 | 0.101 |
| Manufacturing Example 11 | 0 | −0.383 | −0.382 | 0 | 0.103 | 0.104 |
| Manufacturing Example 12 | 0 | 0 | 0 | 0 | 0 | 0 |

TABLE 4

| Classification | Radius 141 mm Thickness change rate | Radius 150 mm Thickness change rate | Center thickness (mm) | Radius 79 mm Thickness (mm) | Eighth profile Thickness (mm) |
|---|---|---|---|---|---|
| Manufacturing Example 7 | 0 | 0 | 25 | 10.3 | 14 |
| Manufacturing Example 8 | 0 | 0 | 24 | 9.3 | 13 |
| Manufacturing Example 9 | 0 | 0 | 26 | 10.9 | 14.6 |
| Manufacturing Example 10 | 0 | 0 | 24.5 | 9.8 | 14 |
| Manufacturing Example 11 | 0 | 0 | 25.3 | 10.5 | 14.2 |
| Manufacturing Example 12 | 0 | 0 | 15 | 15 | 15 |

Manufacturing Example 13

Using the Czochralski method, a silicon ingot having a diameter of approximately 330 mm was manufactured. The silicon ingot was cut using a diamond wire saw to produce a single-crystal silicon plate having a thickness of approximately 20 mm. Then, the edges of the single-crystal silicon plate were cut to form a chamfer surface.

Then, the single-crystal silicon plate that had been subjected to the chamfering process was placed between an upper surface plate and a lower surface plate and wrapped by the upper surface plate and the lower surface plate. Then, the shape of the wrapped single-crystal silicon plate was machined using a grinder. As a result, an unprocessed upper electrode was formed.

The shape machining process was performed under the following conditions.
1) Grinder head. 1000 mesh
2) Grinder rotation rate: 7000 rpm
3) Feed: 0.6 mm/minute Then, the unprocessed upper electrode was immersed in an etchant at room temperature for approximately 63000 seconds to treat the outer surface of the unprocessed upper electrode, thereby producing an upper electrode.

The ingredients of the etchant are as follows.
1) Deionized water: 34.5 parts by weight
2) Sulfuric acid: 50 parts by weight
3) Ammonium hydrogen fluoride: 5 parts by weight
4) Ammonium sulfate: 7 parts by weight
5) Ammonium nitrate: 3.5 parts by weight The lower surface of the upper electrode includes a first profile (radius from 0 to 3.5 mm), a second profile (radius from 3.5 mm to 17 mm), a third profile (radius from 17 mm to 70 mm), a fourth profile (radius from 70 mm to 75 mm), a fifth profile (radius from 75 mm to 108 mm), a sixth profile (radius from 108 mm to 138 mm), a seventh profile (radius from 138 mm to 142 mm), and an eighth profile (radius from 142 mm to 145 mm). In addition, the thickness at the center of the upper electrode was approximately 20 mm. At the fourth profile, the thickness was 10 mm. At the eighth profile, the thickness was approximately 15 mm.

At the center of the first profile, the thickness change rate was 0. At a radius of 3.5 mm, the thickness change rate was −0.245. In addition, from the center of the first profile to a radius of 3.5 mm, the thickness change rate continued to decrease.

In addition, at a radius of 17 mm, the thickness change rate was approximately −0.241. At the second profile, the thickness change rate showed little change within a deviation of approximately 0.01.

In addition, at a radius of 70 mm, the thickness change rate was approximately 0. At the third profile, the thickness change rate continued to increase.

In addition, at a radius of 75 mm, the thickness change rate was approximately 0. At the fourth profile, the thickness change rate was constant. At the fourth profile, the thickness change rate was approximately 0. At the fourth profile, the deviation of the thickness change rate was less than 0.003.

In addition, at a radius of 108 mm, the thickness change rate was approximately 0.13. At the fifth profile, the thickness change rate continued to increase.

In addition, at a radius of 138 mm, the thickness change rate was approximately 0.13. At the sixth profile, the thickness change rate showed little change within a deviation of approximately 0.01.

In addition, at a radius of 142 mm, the thickness change rate was approximately 0. At the seventh profile, the thickness change rate continued to decrease.

In addition, at a radius of 145 mm, the thickness change rate was approximately 0. At the eighth profile, the thickness change rate was constant. At the eighth profile, the thickness change rate was approximately 0. At the eighth profile, the deviation of the thickness change rate was less than 0.003.

Manufacturing Examples 14 to 17

As shown in Tables 5 and 6 below, the shapes of the first profile, the second profile, the third profile, the fourth profile, the fifth profile, the sixth profile, the seventh profile, and the eighth profile were changed.

TABLE 5

| Classification | Radius 0 Thickness change rate | Radius 3.5 mm Thickness change rate | Radius 17 mm Thickness change rate | Radius 70 mm Thickness change rate | Radius 75 mm Thickness change rate | Radius 108 mm Thickness change rate |
|---|---|---|---|---|---|---|
| Manufacturing Example 13 | 0 | −0.245 | −0.241 | 0 | 0 | 0.13 |
| Manufacturing Example 14 | 0 | −0.242 | −0.240 | 0 | 0 | 0.131 |
| Manufacturing Example 15 | 0 | −0.248 | −0.247 | 0 | 0 | 0.132 |
| Manufacturing Example 16 | 0 | −0.246 | −0.243 | 0 | 0 | 0.131 |
| Manufacturing Example 17 | 0 | −0.245 | −0.243 | 0 | 0 | 0.129 |

TABLE 6

| Classification | Radius 138 mm Thickness change rate | Radius 142 mm Thickness change rate | Radius 145 mm Thickness change rate | Center thickness (mm) | Fourth profile thickness (mm) | Eighth profile thickness (mm) |
|---|---|---|---|---|---|---|
| Manufacturing Example 13 | 0.136 | 0 | 0 | 20 | 10 | 15 |
| Manufacturing Example 14 | 0.137 | 0 | 0 | 19 | 9 | 14 |
| Manufacturing Example 15 | 0.138 | 0 | 0 | 21 | 10 | 15 |
| Manufacturing Example 16 | 0.137 | 0 | 0 | 20 | 9.5 | 15 |
| Manufacturing Example 17 | 0.136 | 0 | 0 | 19 | 9.5 | 14.5 |

TABLE 7

| Classification | Upper electrode |
|---|---|
| Example 1 | Manufacturing Example 1 |
| Example 2 | Manufacturing Example 2 |
| Example 3 | Manufacturing Example 3 |
| Example 4 | Manufacturing Example 4 |
| Example 5 | Manufacturing Example 5 |
| Comparative Example 1 | Manufacturing Example 6 |
| Example 6 | Manufacturing Example 7 |
| Example 7 | Manufacturing Example 8 |
| Example 8 | Manufacturing Example 9 |
| Example 9 | Manufacturing Example 10 |
| Example 10 | Manufacturing Example 11 |
| Comparative Example 2 | Manufacturing Example 12 |
| Example 11 | Manufacturing Example 13 |
| Example 12 | Manufacturing Example 14 |
| Example 13 | Manufacturing Example 15 |
| Example 14 | Manufacturing Example 16 |
| Example 15 | Manufacturing Example 17 |

EVALUATION EXAMPLES

1. Thickness Change Rate

Using a contact 3D measuring device (manufacturer MITUTOYO, product name: CRYSTA-APEC C9166), the Examples 1 to 15 and Comparative Examples 1 and 2

As shown in Table 7 below, an upper electrode was mounted on a wafer etching device, and a silicon wafer was placed on the etching device. Then, hydrogen gas, nitrogen gas, and $CH_3F$ were sprayed onto the upper electrode at a flow ratio of approximately 5:1:0.5, turned into plasma, and sprayed on the silicon wafer for approximately 10 minutes to proceed with an etching process.

thickness of the upper electrode was measured in the radius direction with a measurement interval of 0.3 mm. Accordingly, the thickness change rate of the lower surface of the upper electrode was calculated, and the results are shown in Tables 1 and 2.

2. Etching Deviation

In the etched silicon wafer, a first etching thickness etched at the center and a second etching thickness etched at the edge were measured. The deviation between the first etching thickness and the second etching thickness was determined.

The deviation between the first etching thickness and the second etching thickness is a value obtained by dividing the difference between the first etching thickness and the second etching thickness by the first etching thickness.

When the deviation between the first etching thickness and the second etching thickness was less than 0.1: Good When the deviation between the first etching thickness and the second etching thickness was 0.1 or more: Poor 3. Defect Evaluation Using a wafer surface analyzer (WM-3000, Zeus Co.), the number of defects in the etched silicon wafer was measured.

When the number of defects is 10 or less: Good, O

When the number of defects is 11 or more: Poor, X

As shown in Table 8 below, in Examples 1 to 4, the number of defects and the residue content were reduced

TABLE 8

| Classification | Defects | Etching deviation |
|---|---|---|
| Example 1 | O | O |
| Example 2 | O | O |
| Example 3 | O | O |
| Example 4 | O | O |
| Example 5 | O | O |
| Comparative Example 1 | X | X |
| Example 6 | O | O |
| Example 7 | O | O |
| Example 8 | O | O |
| Example 9 | O | O |
| Example 10 | O | O |
| Comparative Example 2 | X | X |
| Example 11 | O | O |
| Example 12 | O | O |
| Example 13 | O | O |
| Example 14 | O | O |
| Example 15 | O | O |

As shown in Table 8, when the methods of fabricating a semiconductor device according to Examples were used, defects and etching deviation were reduced.

DESCRIPTION OF SYMBOLS

10: SEMICONDUCTOR DEVICE FABRICATION APPARATUS
20: PLASMA AREA-CONFINED ASSEMBLY
30: SEMICONDUCTOR SUBSTRATE
102: PLASMA REACTOR
104: PLASMA PROCESSING CHAMBER
106: PLASMA POWER SUPPLY
108: MATCHING NETWORK
110: TCP COIL
112: POWER WINDOW
114: PLASMA AREA
116: BIAS VOLTAGE POWER SUPPLY
118: MATCHING NETWORK
124: CONTROLLER
140: GAS INJECTOR
142: PRESSURE CONTROL VALVE
144: PUMP
210: COVER
220: UPPER ELECTRODE
221: FIRST UPPER SURFACE OF THE UPPER ELECTRODE
222: FIRST LOWER SURFACE OF THE UPPER ELECTRODE
223: FIRST SIDE OF THE UPPER ELECTRODE
226: THROUGH HOLES OF THE UPPER ELECTRODE
230: FOCUS RING
231: SECOND UPPER SURFACE OF THE FOCUS RING
232: SECOND LOWER SURFACE OF THE FOCUS RING
233: SECOND SIDE SURFACE OF THE FOCUS RING
234: SECOND INCLINED SURFACE OF THE FOCUS RING
235: GUIDE SURFACE OF THE FOCUS RING
236: SPACE DEFINED BY FOCUS RING
237: BODY PORTION OF THE FOCUS RING
238: INCLINED PORTION OF THE FOCUS RING
239: GUIDE PORTION OF THE FOCUS RING
240: SECOND INSULATING RING 241: THIRD SIDE OF THE FOCUS RING
250: FIRST INSULATING RING
260: THIRD INSULATING RING
270: ELECTROSTATIC CHUCK
280: DISCHARGE PORTION

What is claimed is:

1. An upper electrode, comprising:
    a flat upper surface;
    a lower surface facing the upper surface; and
    a thickness from the upper surface to the lower surface,
    wherein the lower surface comprises a first profile corresponding to a central area of the lower surface and having a first thickness change rate of −0.1 to 0;
    a second profile surrounding the first profile and having a second thickness change rate;
    a third profile surrounding the first profile and having a third thickness change rate of −0.115 to −0.122;
    a fourth profile surrounding the third profile and having a fourth thickness change rate; and
    a fifth profile surrounding the fourth profile and having a fifth thickness change rate of −0.003 to 0.003,
    wherein the first thickness change rate, the second thickness change rate, the third thickness change rate, the fourth thickness change rate, and the fifth thickness change rate are values obtained by dividing a change in thickness by a change in radius along a horizontal direction parallel to the upper surface from a center of the lower surface.

2. The upper electrode according to claim 1, wherein the first profile corresponds to an area from a center of the upper surface to a first radius in the horizontal direction,
    the third profile corresponds to an area from a second radius, which is larger than the first radius, to a third radius in the horizontal direction, and
    the fifth profile corresponds to an area from a fourth radius, which is larger than the third radius, to a fifth radius.

3. The upper electrode according to claim 2, wherein the first radius is 7.5 mm to 9.5 mm, the second radius is 11 mm to 14 mm, the third radius is 48 mm to 54 mm, the fourth radius is 88 mm to 92 mm, and the fifth radius is 98 mm to 102 mm.

4. The upper electrode according to claim 3, wherein, in the third profile, a deviation of the third thickness change rate is less than 0.005.

5. The upper electrode according to claim 4, wherein, in the fifth profile, a deviation of the fifth thickness change rate is less than 0.005.

6. The upper electrode according to claim 1, wherein the upper electrode comprises single-crystal silicon and has a thickness of 14 mm to 20 mm at a center of the lower surface and a thickness of 6 mm to 10 mm at the fifth profile.

7. The upper electrode according to claim 1, wherein the lower surface comprises the second profile located between the first profile and the third profile; and the fourth profile located between the third profile and the fifth profile.

8. The upper electrode according to claim 7, wherein the second profile has the second thickness change rate of −0.12 to −0.08, and the fourth profile has the fourth thickness change rate of −0.12 to 0.003.

9. The upper electrode according to claim 8, wherein the second thickness change rate gradually decreases as a measurement point moves away from the center of the lower surface, and the fourth thickness change rate gradually increases as a measurement point moves away from the center of the lower surface.

10. The upper electrode according to claim 9, wherein the upper electrode comprises single-crystal silicon, and the first profile, the second profile, the third profile, the fourth profile, and the fifth profile are integrally connected.

11. An upper electrode, comprising:
a flat upper surface;
a lower surface facing the upper surface; and
a thickness from the upper surface to the lower surface,
wherein the lower surface comprises a first profile corresponding to a central area of the lower surface and having a first thickness change rate that gradually decreases from a center of the lower surface to an edge thereof within a range of −0.385 to 0;
a second profile surrounding the first profile and having a second thickness change rate of −0.37 to −0.39;
a third profile surrounding the second profile and having a third thickness change rate that gradually increases from the center of the lower surface to the edge within a range of −0.385 to 0;
a fourth profile surrounding the third profile and having a fourth thickness change rate that gradually increases from the center of the lower surface to the edge within a range of 0 to 0.105;
a fifth profile surrounding the fourth profile and having a fifth thickness change rate of 0.1 to 0.11; and
a seventh profile surrounding the fifth profile and having a seventh thickness change rate of −0.003 to 0.003,
wherein the first thickness change rate, the second thickness change rate, the third thickness change rate, the fourth thickness change rate, the fifth thickness change rate, and the seventh thickness change rate are values obtained by dividing a change in thickness by a change in radius along a horizontal direction parallel to the upper surface from the center of the lower surface.

12. The upper electrode according to claim 11, wherein the first profile corresponds to an area from a center of the upper surface to a first radius in the horizontal direction,
the second profile corresponds to an area from the first radius to a second radius in the horizontal direction,
the third profile corresponds to an area from the second radius to a third radius in the horizontal direction,
the fourth profile corresponds to an area from the third radius to a fourth radius in the horizontal direction, and
the fifth profile corresponds to an area from the fourth radius to a fifth radius.

13. The upper electrode according to claim 12, wherein the first radius is 3 mm to 5 mm, the second radius is 8 mm to 10 mm, the third radius is 75 mm to 85 mm, the fourth radius is 108 mm to 114 mm, and the fifth radius is 138 mm to 141 mm.

14. The upper electrode according to claim 13, wherein the first thickness change rate at the center is −0.003 to 0.003, and the first thickness change rate at the first radius is −0.37 to −0.39.

15. The upper electrode according to claim 13, wherein the third thickness change rate at the second radius is −0.37 to −0.39, and the third thickness change rate at the third radius is −0.003 to 0.003.

16. The upper electrode according to claim 13, wherein the fourth thickness change rate at the third radius is −0.003 to 0.003, and the fourth thickness change rate at the fourth radius is 0.1 to 0.11.

17. The upper electrode according to claim 11, wherein the upper electrode comprises single-crystal silicon, a thickness at the center of the lower surface is 22 mm to 25 mm, a thickness at an area where the third profile and the fourth profile meet is 9 mm to 12 mm, and a thickness at the seventh profile is 11 mm to 16 mm.

18. An upper electrode, comprising:
a flat upper surface;
a lower surface facing the upper surface; and
a thickness from the upper surface to the lower surface,
wherein the lower surface comprises a first profile corresponding to a central area of the lower surface and having a first thickness change rate of −0.25 to 0;
a second profile surrounding the first profile and having a second thickness change rate of −0.25 to −0.24;
a fourth profile surrounding the second profile and having a fourth thickness change rate of −0.003 to 0.003;
a sixth profile surrounding the fourth profile and having a sixth thickness change rate of 0.13 to 0.14; and
an eighth profile surrounding the sixth profile and having an eighth thickness change rate of −0.003 to 0.003,
wherein the first thickness change rate, the second thickness change rate, the fourth thickness change rate, the sixth thickness change rate, and the eighth thickness change rate are values obtained by dividing a change in thickness by a change in radius along a horizontal direction parallel to the upper surface from a center of the lower surface.

19. The upper electrode according to claim 18, wherein the first profile corresponds to an area from a center of the upper surface to a first radius in the horizontal direction,
the second profile corresponds to an area from the first radius to a second radius in the horizontal direction,
the fourth profile corresponds to an area from a third radius to a fourth radius in the horizontal direction,
the sixth profile corresponds to an area from a fifth radius to a sixth radius in the horizontal direction, and
the eighth profile corresponds to an area from a seventh radius to an eighth radius.

20. The upper electrode according to claim 19, wherein the first radius is 3 mm to 5 mm, the second radius is 16 mm to 19 mm, the third radius is 69 mm to 71 mm, the fourth radius is 74 mm to 76 mm, the fifth radius is 106 mm to 108 mm, the sixth radius is 138 mm to 139.5 mm, the seventh radius is 141 mm to 142 mm, and
the eighth radius is 144.5 mm to 150 mm.

* * * * *